(12) United States Patent
Taguchi

(10) Patent No.: US 11,045,834 B2
(45) Date of Patent: Jun. 29, 2021

(54) METHOD FOR PRODUCING FILM

(71) Applicant: FUJIFILM Corporation, Tokyo (JP)

(72) Inventor: Yoshinori Taguchi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/011,939

(22) Filed: Jun. 19, 2018

(65) Prior Publication Data

US 2018/0297056 A1 Oct. 18, 2018

Related U.S. Application Data

(63) Continuation of application No. PCT/JP2017/000766, filed on Jan. 12, 2017.

(30) Foreign Application Priority Data

Feb. 2, 2016 (JP) .............................. JP2016-017943

(51) Int. Cl.
  *B05D 3/02* (2006.01)
  *C08F 2/44* (2006.01)
  (Continued)

(52) U.S. Cl.
  CPC ........... *B05D 3/0218* (2013.01); *B05D 3/007* (2013.01); *B05D 7/24* (2013.01); *C08F 2/44* (2013.01); *C08F 2/48* (2013.01); *C08F 2/50* (2013.01); *C08F 220/06* (2013.01); *C08F 220/28* (2013.01); *C09D 4/06* (2013.01); *G03F 7/004* (2013.01); *G03F 7/033* (2013.01); *G03F 7/105* (2013.01); *G03F 7/16* (2013.01);
  (Continued)

(58) Field of Classification Search
  None
  See application file for complete search history.

(56) References Cited

U.S. PATENT DOCUMENTS 5,319,014 A * 6/1994 Moorman ................. C08F 2/44
                                                            524/427
5,661,219 A * 8/1997 Nakane ................. C08L 101/02
                                                            525/166

(Continued)

FOREIGN PATENT DOCUMENTS

JP    10-237272 A    9/1998
JP    2005-36236 A   2/2005

(Continued)

OTHER PUBLICATIONS

International Preliminary Report on Patentability and Written Opinion of the International Searching Authority(Forms PCT/IB/326, PCT/IB/373 and PCT/ISA/237), dated Aug. 16, 2018, for International Application No. PCT/JP2017/000766, with an English Translation of the Written Opinion.

(Continued)

*Primary Examiner* — Shamim Ahmed
*Assistant Examiner* — Bradford M Gates
(74) *Attorney, Agent, or Firm* — Birch, Stewart, Kolasch & Birch, LLP

(57) ABSTRACT

A method for producing a film comprises preserving a composition including a pigment, a resin, and a solvent under a condition of a viscosity ranging from 30 mPa·s to 150 mPa·s, and heating the composition to 40° C. to 70° C. so as to be applied during the application of the composition.

17 Claims, 1 Drawing Sheet

(51) Int. Cl.
| | |
|---|---|
| *G03F 7/033* | (2006.01) |
| *C08F 220/06* | (2006.01) |
| *C09D 4/06* | (2006.01) |
| *C08F 220/28* | (2006.01) |
| *G03F 7/105* | (2006.01) |
| *G03F 7/16* | (2006.01) |
| *C08F 2/50* | (2006.01) |
| *C08F 2/48* | (2006.01) |
| *G03F 7/004* | (2006.01) |
| *G03F 7/38* | (2006.01) |
| *B05D 3/00* | (2006.01) |
| *B05D 7/24* | (2006.01) |
| *C08K 3/22* | (2006.01) |
| *C08F 222/10* | (2006.01) |
| *C08K 3/26* | (2006.01) |
| *C08K 3/30* | (2006.01) |

(52) U.S. Cl.
CPC .......... *G03F 7/38* (2013.01); *C08F 222/1006* (2013.01); *C08K 2003/2241* (2013.01); *C08K 2003/265* (2013.01); *C08K 2003/3045* (2013.01); *C08K 2201/003* (2013.01); *C08K 2201/011* (2013.01)

(56) References Cited

U.S. PATENT DOCUMENTS

| | | | |
|---|---|---|---|
| 5,922,633 A | 7/1999 | Nakane et al. | |
| 6,066,690 A * | 5/2000 | Shibata | C08K 9/00 428/1.27 |
| 2004/0086658 A1* | 5/2004 | Onoyama | B05D 7/572 427/458 |
| 2011/0091703 A1* | 4/2011 | Okamoto | C08L 83/06 428/220 |
| 2014/0147776 A1* | 5/2014 | Ito | G03F 7/038 430/18 |
| 2015/0166780 A1* | 6/2015 | Arayama | C08K 9/04 522/39 |

FOREIGN PATENT DOCUMENTS

| | | |
|---|---|---|
| JP | 2015-34961 A | 2/2015 |
| JP | 2015-67764 A | 4/2015 |
| WO | WO-2014034813 A1 * | 3/2014 ............. C08L 33/02 |

OTHER PUBLICATIONS

International Search Report (Form PCT/ISA/210), dated Apr. 11, 2017, for International Application No. PCT/JP2017/000766, with an English translation.

Japanese Office Action for corresponding Japanese Application No. 2017-565448, dated Sep. 3, 2019, with English translation of the Office Action.

* cited by examiner

METHOD FOR PRODUCING FILM

CROSS-REFERENCE TO RELATED APPLICATIONS

This application is a Continuation of PCT International Application No. PCT/JP2017/000766, filed on Jan. 12, 2017, which claims priority under 35 U.S.C. § 119(a) to Japanese Patent Application No. 2016-17943, filed on Feb. 2, 2016. Each of the above application(s) is hereby expressly incorporated by reference, in its entirety, into the present application.

BACKGROUND OF THE INVENTION

1. Field of the Invention

The present invention relates to a method for producing a film.

2. Description of the Related Art

A film can be produced using a composition including a pigment, a resin, and a solvent. Further, in recent years, a film has been produced using a composition including a white pigment such as titanium oxide (see JP2015-34961A and JP2015-67764A).

SUMMARY OF THE INVENTION

In production of a film using a composition including a pigment, a resin, and a solvent, in a case where the stability of the composition is low, the pigment and the like are sedimented. As a result, coatability is reduced, and coating unevenness easily occurs in the obtained film. In particular, with a composition including a high-density inorganic pigment such as a white pigment, the pigment is easily sedimented and a further improvement in the coatability is required.

Therefore, an object of the present invention is to provide a method for producing a film, which is capable of producing a film having suppressed coating unevenness by applying a composition including a pigment, a resin, and a solvent with good coatability.

Under these circumstances, the present inventors have conducted extensive studies, and as a result, they have found that the object can be accomplished by adopting the following configuration, leading to completion of the present invention. Accordingly, the present invention provides the following aspects.

<1> A method for producing a film, comprising:
preserving a composition including a pigment, a resin, and a solvent under a condition of a viscosity ranging from 30 mPa·s to 150 mPa·s; and
heating the composition to 40° C. to 70° C. so as to be applied during the application of the composition.

<2> The method for producing a film as described in <1>, in which the composition during the preservation has a sedimentation rate of a solid content of the composition of 10% by mass or less, when centrifuged under a condition of 3,500 revolutions for 47 minutes at a temperature for the preservation of the composition.

<3> The method for producing a film as described in <1> or <2>,
in which the composition is heated to 40° C. to 70° C. to adjust the viscosity of the composition to 1 mPa·s or more and less than 30 mPa·s during the application of the composition.

<4> The method for producing a film as described in any one of <1> to <3>,
in which the composition is preserved at −20° C. to 30° C. during the preservation of the composition.

<5> The method for producing a film as described in any one of <1> to <4>,
in which the composition is preserved by stirring intermittently, discontinuously, or continuously during the preservation of the composition.

<6> The method for producing a film as described in any one of <1> to <5>,
in which the composition is preserved by allowing the composition to flow intermittently, discontinuously, or continuously during the preservation of the composition.

<7> The method for producing a film as described in any one of <1> to <6>,
in which the application is carried out by a spin coating method, a screen printing method, or a spray application method.

<8> The method for producing a film as described in any one of <1> to <7>,
in which the pigment includes an inorganic pigment.

<9> The method for producing a film as described in <8>,
in which the inorganic pigment includes a white pigment.

<10> The method for producing a film as described in <8> or <9>,
in which the inorganic pigment includes a metal or metal oxide.

<11> The method for producing a film as described in any one of <8> to <10>,
in which the inorganic pigment includes titanium oxide.

<12> The method for producing a film as described in <11>,
in which an average primary particle diameter of the titanium oxide is 50 nm or more.

<13> The method for producing a film as described in any one of <1> to <12>,
in which the composition further includes a polymerizable compound and a photopolymerization initiator.

<14> The method for producing a film as described in any one of <1> to <13>,
in which the composition further includes a coloring inhibitor. <15> The method for producing a film as described in <14>,
in which the coloring inhibitor is a phenol compound.
<16> The method for producing a film as described in any one of <1> to <15>,
in which the composition further includes an epoxy compound. <17> The method for producing a film as described in any one of <1> to <16>, further comprising forming a pattern on a film formed by the application of the composition.

<18> A device for producing a film, comprising:
a preservation unit that preserves a composition including a pigment, a resin, and a solvent with a viscosity ranging from 30 mPa·s to 150 mPa·s;
a heater that heats the composition preserved in the preservation unit to 40° C. to 70° C.;
discharge nozzles that discharge the composition heated in the heater; and
a spin coater that spin-coats the composition discharged from the discharge nozzles.

<19> The device for producing a film as described in <18>,
in which the preservation unit has a stirrer.

<20> The device for producing a film as described in <18> or <19>, in which the preservation unit has a storage tank for a composition and a circulation path for circulating the composition in the storage tank.

<21> The device for producing a film as described in <20>, in which the storage tank has a stirrer.

<22> The device for producing a film as described in any one of <18> to <21>, in which the preservation unit has a cooler.

According to the present invention, it is possible to provide a method for producing a film, which is capable of producing a film having suppressed coating unevenness by applying a composition including a pigment, a resin, and a solvent with good coatability.

DESCRIPTION OF THE PREFERRED EMBODIMENTS

Figure 1:
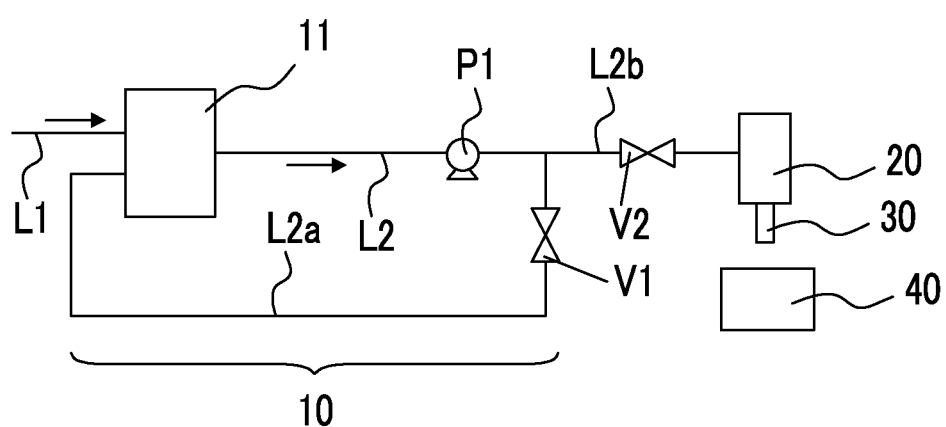
FIG. 1 is a schematic diagram showing one embodiment of a device for producing a film.

Hereinafter, the contents of the present invention will be described in detail.

Description of configuration requirements described below may be made on the basis of representative embodiments of the present invention, but the present invention is not limited to such embodiments.

In the present specification, a numerical range expressed using "to" means a range that includes the preceding and succeeding numerical values of "to" as the lower limit value and the upper limit value, respectively.

In citations for a group (atomic group) in the present specification, in a case where the group (atomic group) is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "(meth)acrylate" represents acrylate and methacrylate, "(meth)acryl" represents acryl and methacryl, and "(meth)acryloyl" represents acryloyl and methacryloyl.

In the present specification, "light" means actinic rays or radiation. Further, "actinic rays" or "radiation" means, for example, a bright line spectrum of a mercury lamp, far ultraviolet rays typified by an excimer laser, extreme ultraviolet rays (EUV light), X-rays, electron beams, or the like.

In the present specification, "exposure" includes, unless otherwise specified, not only exposure using a bright line spectrum of a mercury lamp, far ultraviolet rays typified by an excimer laser, X-rays, EUV light, or the like, but also lithography by particle rays such as electron beams and ion beams.

In the present specification, a weight-average molecular weight and a number-average molecular weight are defined as values in terms of polystyrene, as measured by means of gel permeation chromatography (GPC). In the present specification, the weight-average molecular weight (Mw) and the number-average molecular weight (Mn) can be determined, for example, by using HLC-8220 (manufactured by Tosoh Corporation), TSKgel Super AWM-H (manufactured by Tosoh Corporation, 6.0 mm (inner diameter)×15.0 cm) as columns, and a 10 mmol/L lithium bromide N-methylpyrrolidinone (NMP) solution as an eluent.

In the method for producing a film of the present invention, a composition including a pigment, a resin, and a solvent is preserved under a condition of a viscosity ranging from 30 mPa·s to 150 mPa·s, and the composition is heated to 40° C. to 70° C. to be applied during an application of the composition.

According to the present invention, the coatability of the composition is good, and thus, it is possible to form a film having suppressed coating unevenness. Since the above-mentioned composition is preserved under a condition of a viscosity ranging from 30 mPa·s to 150 mPa·s, the sedimentation of a solid content such as a pigment during the preservation can be suppressed. Further, since the above-mentioned composition is heated to 40° C. to 70° C. during the application, the fluidity of the composition is improved, and the composition can be applied with good coatability. As a result, it is possible to produce a film having suppressed coating unevenness. In the method for producing a film of the present invention, the coatability of the composition is excellent, and thus, the method is effective, particularly in a case of application by a spin coating method, a screen printing method, or a spray application method.

Furthermore, in the present specification, the viscosity is a value measured under a condition of a rotation speed of 5 revolutions per minute (rpm), using an E type viscometer (RE85L manufactured by Toki Sangyo Co., Ltd.) with 1°34'×R24 as a rotor. In addition, in a case where the measurement cannot be performed under the above-mentioned condition, the rotation speed was appropriately changed to perform the measurement.

Moreover, in the method for producing a film of the present invention, it is possible to produce a film having suppressed coating unevenness by preserving a composition including a pigment, a resin, and a solvent under a condition of a sedimentation rate of a solid content, measured by a method which will be described later method, of 10% by mass or less, and applying the composition after being heated to 40° C. to 70° C.

<Composition>

First, a composition in the method for producing a film of the present invention will be described. The composition for use in the method for producing a film of the present invention includes a pigment, a resin, and a solvent.

The viscosity of the composition at 23° C. is preferably from 30 mPa·s to 150 mPa·s. The upper limit is preferably 125 mPa·s or less, and more preferably 100 mPa·s or less. The lower limit is preferably 40 mPa·s or more, and more preferably 50 mPa·s or more.

The viscosity of the composition at a temperature for the preservation is preferably from 30 mPa·s to 150 mPa·s. The upper limit is preferably 120 mPa·s or less, and more preferably 100 mPa·s or less. The lower limit is preferably 40 mPa·s or more, and more preferably 50 mPa·s or more. The temperature for the preservation is preferably −20° C. to 30° C. or lower. The lower limit is preferably 0° C. or higher. The upper limit is preferably 25° C. or lower. Examples of a method for enhancing the viscosity of the composition during the preservation include a method of lowering the temperature for the preservation and a method of adding a thickener that enhances the concentration of the solid content of the composition (preferably the content of the resin in the solid content).

The viscosity of the composition at a temperature for the application is preferably 1 mPa·s or more and less than 30 mPa·s. The upper limit is preferably 25 mPa·s or less, and more preferably 20 mPa·s or less. The lower limit is preferably 3 mPa·s or more, and more preferably 5 mPa·s or more.

Furthermore, the composition during the preservation has a sedimentation rate of a solid content of the composition of preferably 10% by mass or less, and more preferably 5% by mass or less, when centrifuged under a condition of 3,500 revolutions for 47 minutes at a temperature for the preservation of the composition. A method for measuring the sedimentation rate of the solid content of the composition will be described in detail. First, the solid content of the composition is measured under a condition of 160° C. and 1 hour, using an oven. Further, for a supernatant after subjecting the composition to a centrifugation treatment for 47 minutes under a condition of 3,500 revolutions at the temperature in the preservation of the composition (for example, 23° C. in a case of preservation at 23° C.), the same solid content after centrifugation was calculated by the same method. The ratio of the solid content included in the supernatant after centrifugation relative to the solid content of the composition is measured as a sedimentation rate of a solid content. Examples of a method for lowering the sedimentation rate of the solid content of the composition during the preservation include increasing the viscosity of the composition, decreasing the concentration of the solid content of the composition, increasing the dispersity of the solid content (preferably a pigment) in the composition, decreasing the density of a pigment, and decreasing the particle diameter of a pigment.

The thixotropy of the composition at a temperature for the application is preferably low. The thixotropy can be expressed as an index for a TI value. For example, in the viscosity measured using an E type viscometer (RE85L manufactured by Toki Sangyo Co., Ltd.), a value of η (5 rpm)/(50 rpm) in which the viscosity at a rotation speed of 5 rpm and the viscosity at a rotation speed of 50 rpm are defined as η (5 rpm) and η (50 rpm), respectively, is defined as a TI value. As the TI value is closer to 1, the thixotropy is lower. From the viewpoint of spin coating suitability, the TI value obtained by such a measurement method is preferably from 1.0 to 2.0, more preferably from 1.0 to 1.5, and most preferably from 1.0 to 1.2.

The concentration of the solid content of the composition is preferably 25% to 70% by mass. The upper limit is more preferably 60% by mass or less. The lower limit is more preferably 30% by mass or more. By setting the concentration of the solid content of the composition to a range, the viscosity of the composition can be enhanced, and thus, the sedimentation of the pigment or the like during the preservation can be effectively suppressed.

Hereinafter, the composition will be described in detail.

<<Pigment>>

The composition for use in the method for producing a film of the present invention contains a pigment. Examples of the pigment include various inorganic pigments and organic pigments known in the related art. It is preferable that the pigment includes at least inorganic pigments. The inorganic pigments have a higher density than that of the organic pigments, and more easily undergo sedimentation within the composition. However, according to the present invention, even in a case of incorporation of a pigment that easily undergoes sedimentation, the composition can be applied with good coatability by suppressing the sedimentation of the pigment, and thus, it is possible to produce a film having suppressed coating unevenness. As a result, the effect is more remarkable, in particular in a case where an inorganic pigment is included as the pigment.

In the present invention, the pigment may be any one of a chromatic color pigment, a black pigment, and a white pigment. A case of using the white pigment is particularly effective. Further, the white pigment in the total amount of the pigment is a pigment which has a high density and easily undergoes occurrence of sedimentation in the composition. However, according to the present invention, even in a case of incorporation of a white pigment, the composition can be applied with good coatability due to suppressed sedimentation of the white pigment, and thus, it is possible to produce a film having suppressed coating unevenness, which is thus more effective, in particular in a case where the white pigment is included as the pigment. In addition, in the present invention, the chromatic color pigment means a pigment other than a white pigment and a black pigment. The chromatic color pigment is preferably a pigment having a maximum absorption at a wavelength in the range of 400 nm or more and less than 650 nm. Further, in the present invention, the white pigment includes not only pure white, but also bright grey close to white (for example, off-white and light grey), and the like.

In the present invention, the density of the pigment is preferably 1.0 to 6.0 $g/cm^3$. The lower limit is more preferably 2.5 $g/cm^3$ or more, and still more preferably 3.0 $g/cm^3$ or more. The upper limit is more preferably 4.5 $g/cm^3$ or less. As the density of the pigment is higher, the sedimentation in the composition easily occurs, but according to the present invention, even in a case where the composition includes a pigment having a high density, it can be applied with good coatability due to suppressed sedimentation of the pigment, and therefore, it is possible to produce a film having suppressed coating unevenness. As a result, the effect is more remarkable, particularly in a case of using a pigment having a high density. Further, the ratio of the pigment having a density of 2.5 $g/cm^3$ or more (preferably 3.0 $g/cm^3$ or more) relative to the total amount of the pigment is preferably 5% by mass or more, and more preferably 10% by mass or more. The upper limit can be set to 100% by mass or to 99% by mass or less. According to this aspect, the effect of the present invention is more remarkably obtained.

The average primary particle diameter of the pigments is preferably 10 nm or more, more preferably 50 nm or more, still more preferably 100 nm or more, and particularly preferably 150 nm or more. The upper limit is preferably 1000 nm or less, more preferably 500 nm or less, and still more preferably 300 nm or less. In particular, in a case where the pigment is a white pigment, by setting the average primary particle diameter to 150 nm or more, a good whiteness is obtained. The primary particle diameter of the pigments can be determined by observing a portion in which particles are not aggregated through observation by means of a scanning electron microscope (SEM) or a transmission electron microscope (TEM). Further, in the present invention, the average primary particle diameter of the pigments is calculated by taking a transmission electron micrograph of primary particles of the pigment using an electron microscope (H-7000) manufactured by Hitachi Ltd., then measuring a particle size distribution by means of an image processing apparatus (LUZEX AP manufactured by Nireco Corporation) using the photograph, and taking a number-average diameter calculated from the particle size distribution as an average primary particle diameter.

As the average primary particle diameter of the pigment is larger, the sedimentation in the composition more easily occurs, but according to the present invention, even in a case of including a pigment having a large average primary particle diameter, a composition can be applied with good coatability due to suppressed sedimentation of the pigment, and thus, it is possible to produce a film having suppressed coating unevenness. As a result, the effect is more remarkable, particularly in a case of using a pigment having a high average primary particle diameter.

(Inorganic Pigment)

In the present invention, the inorganic pigment is preferably a metal or a metal oxide, and more preferably titanium oxide.

Furthermore, the inorganic pigment is preferably a white pigment. Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably a particle having titanium atoms, and more preferably titanium oxide. Further, titanium oxide has a purity of titanium dioxide ($TiO_2$) of preferably 70% or more, more preferably 80% or more, and still more preferably 85% or more. As for titanium oxide, the content of lower titanium oxide, titanium oxynitride, or the like which is represented by $Ti_nO_{2n-1}$ (n represents a number of 2 to 4) is preferably 30% by mass or less, more preferably 20% by mass or less, and still more preferably 15% by mass or less.

Titanium oxide may be either rutile type titanium oxide or anatase type titanium oxide, and from the viewpoints of coloring properties, opacifying properties, and the stability of a composition, the rutile type titanium oxide is preferable. Particularly, a cured film obtained using the rutile type titanium oxide has a small change in color differences and good coloring properties even in a case where the cured film is heated. Further, the rutile content of titanium oxide is preferably 95% or more.

As the rutile type titanium oxide, known ones can be used. As a method for producing the rutile type titanium oxide, there are two kinds of methods, a sulfuric acid method and a chlorine method, and in the present invention, rutile type titanium oxide produced by any of the methods can be suitably used. Here, the sulfuric acid method refers to a method in which ilmenite ore or titanium slag is used as a raw material, which is dissolved in concentrated sulfuric acid to separate iron as iron sulfate, and the solution is hydrolyzed to obtain a precipitate of hydroxide, and the hydroxide is calcined at a high temperature to recover rutile type titanium oxide. On the other hand, the chlorine method refers to a production method in which synthetic rutile or natural rutile used as a raw material is reacted with chlorine gas and carbon at a high temperature of about 1,000° C. to synthesize titanium tetrachloride, which is oxidized to extract rutile type titanium oxide. The rutile type titanium oxide is preferably rutile type titanium oxide obtained by the chlorine method.

In a view of scattering light to be seen as white light, the average primary particle diameter of the titanium oxide particles is preferably 50 nm or more, more preferably 100 nm or more, and particularly preferably 150 nm or more. The upper limit of the average primary particle diameter of the titanium oxide is not particularly limited, and is preferably 1,000 nm or less, more preferably 500 nm or less, and still more preferably 300 nm or less.

The refractive index of titanium oxide is not particularly limited, and is preferably 1.75 to 2.70, and more preferably 1.90 to 2.70. The specific surface area of titanium oxide, a value measured by a Brunauer, Emmett, Teller (BET) method, is preferably 10 to 400 $m^2/g$, more preferably 10 to 200 $m^2/g$, still more preferably 10 to 150 $m^2/g$, particularly preferably 10 to 40 $m^2/g$, and most preferably 10 to 20 $m^2/g$.

The pH of titanium oxide is preferably 6 to 8. The oil absorption amount (g/100 g) of titanium oxide is preferably 10 to 60 (g/100 g), and more preferably 10 to 40 (g/100 g).

For titanium oxide, the total amount of $Fe_2O_3$, $Al_2O_3$, $SiO_2$, $Nb_2O_5$, and $Na_2O$ is preferably 0.1% by mass or less, more preferably 0.05% by mass or less, still more preferably 0.02% by mass or less, and particularly preferably zero. The shape of titanium oxide is not particularly limited, and examples thereof include shapes such as an isotropic shape (for example, spherical and polyhedral shapes), an anisotropic shape (for example, acicular, rod-like, and plate-like shapes), and an amorphous shape.

Titanium oxide may be one which has been surface-treated with an organic compound. Examples of the organic compound used for the surface treatment include a polyol, aluminum oxide, aluminum hydroxide, silica, alkanolamine, stearic acid, organosiloxane, zirconium oxide, a silane coupling agent, and a titanate coupling agent. Among those, the silane coupling agent is preferable. Further, titanium oxide is preferably one which has been treated with aluminum (Al), silicon (Si), and organic substance. The surface treatment may be carried out with only one kind of surface treating agent or a combination of two or more kinds of surface treating agents. In addition, it is also more preferable that the surface of titanium oxide is coated with an oxide of aluminum, silicon, zirconia, or the like. By this, weather resistance and dispersibility are further improved.

It is also preferable that an inorganic pigment is coated by a basic metal oxide or a basic metal hydroxide. Examples of the basic metal oxide or the basic metal hydroxide include metal compounds containing magnesium, zirconium, cerium, strontium, antimony, barium, calcium, or the like.

The inorganic pigment coated by a basic metal oxide or a basic metal hydroxide can be obtained, for example, as follows.

An inorganic pigment is dispersed in water or a liquid including water as a main component, thereby obtaining a slurry. The inorganic pigment is pulverized using a sand mill, a ball mill, or the like, as desired. Then, the pH of the slurry is adjusted to make the slurry neutral or alkaline, or acidic, as desired. Thereafter, a water-soluble salt thereof which serves as a raw material for a coating material is added to the slurry to coating the surface of the inorganic pigment. Thereafter, the slurry was neutralized to recover the inorganic pigment. The recovered inorganic pigment may be dried or dry-pulverized.

It is preferable that the inorganic pigment has an acidic site and is surface-treated with a compound capable of reacting with the acidic site. Examples of the compound capable of reacting with the acidic site of the inorganic pigment include polyhydric alcohols such as trimethylolpropane, trimethylolethane, ditrimethylolpropane, trimethylolpropane ethoxylate, and pentaerythritol, alkanolamines such as monoethanolamine, monopropanolamine, diethanolamine, dipropanolamine, triethanolamine and tripropanolamine, chlorosilanes, and alkoxysilanes.

Examples of a method in which an inorganic pigment is reacted with a compound capable of reacting with an acidic site of the inorganic pigment include (1) a method in which the compound and an inorganic pigment are put into a dry pulverizer such as a fluid energy pulverizer and an impact pulverizer, and the inorganic pigment is pulverized, (2) a method in which the compound and the dry-pulverized inorganic pigment were stirred and mixed using a high-speed stirrer such as a Henschel mixer and a super mixer, and (3) a method in which the compound is added to an aqueous slurry of the inorganic pigments, and stirred.

As the inorganic pigment, a commercially available product can be preferably used. Examples of the commercially available product of titanium oxide include trade names TIPAQUE R-550, R-580, R-630, R-670, R-680, R-780, R-780-2, R-820, R-830, R-850, R-855, R-930, R-980, CR-50, CR-50-2, CR-57, CR-58, CR-58-2, CR-60, CR-60-2, CR-63, CR-67, CR-Super70, CR-80, CR-85, CR-90, CR-90-2, CR-93, CR-95, CR-953, CR-97, PF-736, PF-737, PF-742, PF-690, PF-691, PF-711, PF-739, PF-740, PC-3, S-305, CR-EL, PT-301, PT-401 M, PT-401 L, PT-501 A, PT-501R, UT771, TTO-80A, and A-220, manufactured by ISHIHARA SANGYO KAISHA, LTD.; trade names R-3L, R-5N, R-7E, R-11P, R-21, R-25, R-32, R-42, R-44, R-45M, R-62N, R-310, R-650, SR-1, D-918, GTR-100, FTR-700, TCR-52, A-110, A-190, SA-1, SA-1L, and TCA-123E, manufactured by Sakai Chemical Industry Co., Ltd.; trade names JR, JRNC, JR-301, JR-403, JR-405, JR-600A, JR-600E, JR-603, JR-605, JR-701, JR-800, JR-805, JR-806, JR-1000, MT-01, MT-05, MT-10EX, MT-100S, MT-100TV, MT-100Z, MT-100AQ, MT-100WP, MT-100SA, MT-100HD, MT-150EX, MT-150W, MT-300HD, MT-500B, MT-500SA, MT-500HD, MT-600B, MT-600SA, MT-700B, and MT-700HD, manufactured by TAYCA CORPORATION; trade names KR-310, KR-380, and KR-380N, manufactured by Titan Kogyo, Ltd.; trade names TR-600, TR-700, TR-750, TR-840, and TR-900, manufactured by Fuji Titanium Industry Co., Ltd.; and trade name Brilliant 1500 manufactured by Shiraishi Calcium Kaisha, Ltd. Further, titanium oxide described in paragraphs 0025 to 0027 of JP2015-67794A can also be used.

In addition, examples of a commercially available product of strontium titanate include SW-100 (manufactured by Titan Kogyo, Ltd.). Examples of a commercially available product of barium sulfate include BF-1L (manufactured by Sakai Chemical Industry Co., Ltd.).

In the present invention, inorganic pigments may include not only particles including only singular inorganic substance or particles as a composite with other materials. It is preferable to use, for example, particles having pores or other materials therein, particles having a number of inorganic particles attached to core particles, or core-shell composite particles including core particles including polymer particles and a shell layer including inorganic fine nanoparticles. With regard to the core shell composite particles including core particles including polymer particles and a shell layer including inorganic fine nanoparticles, reference can be made to, for example, the descriptions in paragraphs 0012 to 0042 of JP2015-47520A, the contents of which are incorporated herein by reference.

In the present invention, a black pigment can also be used as the pigment. The black pigment is not particularly limited, and known black pigments can be used. Examples thereof include carbon black, titanium black, and graphite, with carbon black and titanium black being preferable, and titanium black being particularly preferable. Titanium black is a black particle containing a titanium atom, and preferably lower titanium oxide or titanium oxynitride. Titanium black can modify the surface, as desired, for the purpose of improvement of dispersity, suppression of aggregation, and the like. It is possible to coat the surface of titanium black with silicon oxide, titanium oxide, germanium oxide, aluminum oxide, magnesium oxide, or zirconium oxide, and a treatment of a water-repellant as shown in JP2007-302836A can also be carried out. Specific examples of the black pigment include C. I. Pigment Black 1 and 7, and a titanium black pigment.

Titanium black is preferably one having small primary particle diameters of the individual particles as well as a small average primary particle diameter thereof. Specifically, the average primary particle diameter is preferably in a range of 10 nm to 45 nm.

The specific surface area of titanium black is not particularly limited, but the value measured by a Brunauer, Emmet and Teller's (BET) method is preferably from 5 $m^2/g$ to 150 $m^2/g$, and more preferably from 20 $m^2/g$ to 120 $m^2/g$ so that the water repellency of the titanium black after the surface treatment using the water-repellent agent exhibits a predetermined performance. Examples of commercially available product of titanium black include titanium black 10S, 12S, 13M, 13M-C, 13R, 13R-N, and 13M-T (trade names: manufactured by Mitsubishi Materials Corporation), and Tilack D (trade name: manufactured by Akokasei Co., Ltd.).

Titanium black can also be used as a dispersion. Examples of the dispersion include a dispersion that includes titanium black particles and silica particles, and the content ratio of Si atoms to Ti atoms in the dispersion is adjusted to a range of 0.20 to 0.50. With regard to the dispersion, reference can be made to the descriptions in paragraphs 0020 to 0105 of JP2012-169556A, the contents of which are incorporated herein by reference.

In the present invention, a chromatic color pigment can also be used as the pigment. The chromatic color pigment is not particularly limited, and known chromatic color pigments can be used. Examples thereof include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (all yellow pigments), C. I. Pigment Orange 2, 5, 13, 16, 17:1, 31, 34, 36, 38, 43, 46, 48, 49, 51, 52, 55, 59, 60, 61, 62, 64, 71, 73, and the like (all orange pigments), C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like (all red pigments), C. I. Pigment Green 7, 10, 36, 37, 58, 59, and the like (all green pigments), C. I. Pigment Violet 1, 19, 23, 27, 32, 37, 42, and the like (all violet pigments), C. I. Pigment Blue 1, 2, 15, 15:1, 15:2, 15:3, 15:4, 15:6, 16, 22, 60, 64, 66, 79, 80, and the like (all blue pigments)

The content of the pigment is preferably 1% by mass or more, more preferably 3% by mass or more, and particularly preferably 5% by mass or more, with respect to the total solid content of the composition. The upper limit is not particularly limited, and is more preferably 70% by mass or less, still more preferably 60% by mass or less, and most preferably 50% by mass or less, with respect to the total solid content of the composition.

Furthermore, the proportion of the inorganic pigment in the pigment is preferably 50% by mass or more, and more preferably 80% by mass or more. The upper limit can be set to 100% by mass, or to 99% by mass or less. From the viewpoints of the whiteness, the transmittance, and the lithographic characteristics, the upper limit is preferably 99% by mass or less, and more preferably 95% by mass or less.

Moreover, the proportion of the white pigment in the pigment is preferably 50% by mass or more, and more preferably 80% by mass or more. The upper limit can be set to 100% by mass, or to 99% by mass or less. From the viewpoints of the whiteness, the transmittance, and the lithographic characteristics, the upper limit is preferably 99% by mass or less, and more preferably 95% by mass or less.

In addition, the proportion of titanium oxide in the pigment is preferably 50% by mass or more, and more preferably 80% by mass or more. The upper limit can be set to 100% by mass, or to 99% by mass or less. From the viewpoints of the whiteness, the transmittance, and the lithographic characteristics, the upper limit is preferably 99% by mass or less, and more preferably 95% by mass or less.

Furthermore, the proportion of the particles having an average primary particle diameter of 50 nm or more in the pigment is preferably 50% by mass or more, and more preferably 80% by mass or more. The upper limit can be set to 100% by mass, or to 99% by mass or less. From the viewpoints of the whiteness, the transmittance, and the lithographic characteristics, the upper limit is preferably 99% by mass or less, and more preferably 95% by mass or less.

Moreover, the proportion of the particles having a density of 1.0 to 6.0 g/cm$^3$ in the pigment is preferably 50% by mass or more, and more preferably 80% by mass or more. The upper limit can be set to 100% by mass, or to 99% by mass or less. From the viewpoints of the whiteness, the transmittance, and the lithographic characteristics, the upper limit is preferably 99% by mass or less, and more preferably 95% by mass or less.

<<Resin>>

The composition for use in the method for producing a film of the present invention includes a resin. The resin is blended in, for example, an application for dispersing a pigment in the composition or an application as a binder. Incidentally, a resin which is used for dispersing a pigment in a composition is also referred to as a dispersant. However, such uses of the resin are only exemplary, and the resin can also be used for other purposes, in addition to such uses.

The weight-average molecular weight (Mw) of the resin is preferably 2,000 to 2,000,000. The upper limit is preferably 1,000,000 or less, and more preferably 500,000 or less. The lower limit is preferably 3,000 or more, and more preferably 5,000 or more.

The content of the resin is preferably 0.1% to 90% by mass, with respect to the total solid content of the composition. The lower limit is preferably 0.1% by mass or more, and more preferably 20% by mass or more. The upper limit is preferably 70% by mass or less, and more preferably 50% by mass or less. The resin may be included singly or in combination of two or more kinds thereof. In a case where the resins are used in combination of two or more kinds thereof, the total amount thereof is preferably in the range.

(Binder)

The composition for use in the method for producing a film of the present invention preferably contains a binder as the resin. By incorporation of the binder, the film characteristics are improved. As the binder, any of known binders can be used. Preferably, a resin which is soluble or swellable in water or weakly alkaline water is chosen so as to allow water development or weakly alkaline water development. For example, alkali development can be performed using an alkali-soluble resin. Examples of such the resin include radical polymers having a carboxyl group in the side chain, for example, the polymers described in JP1984-44615A (JP-S59-44615A), JP1979-34327B (JP-S54-34327B), JP1983-12577A (JP-S58-12577A), and JP1979-25957B (JP-S54-25957B), JP1979-92723A (JP-S54-92723A), JP1984-53836A (JP-S59-53836A), and JP1984-71048A (JP-S59-71048A), that is, a resin obtained by homopolymerizing or copolymerizing a monomer having a carboxyl group; a resin obtained by homopolymerizing or copolymerizing a monomer having an acid anhydride, and subjecting the acid anhydride unit to hydrolysis, semi-esterification or semi-amidation; and an epoxy acrylate obtained by modifying an epoxy resin with an unsaturated monocarboxylic acid and an acid anhydride. Examples of the monomers having a carboxyl group include acrylic acid, methacrylic acid, itaconic acid, crotonic acid, maleic acid, fumaric acid, and 4-carboxylstyrene, and examples of the monomers having an acid anhydride include maleic anhydride. Further, other examples thereof include an acidic cellulose derivative having a carboxyl group in a side chain, and in addition, a polymer having a hydroxyl group with a cyclic acid anhydride, and the like. The binder is preferably a resin which is soluble in an alkali developer. That is, the binder is also preferably an alkali-soluble resin.

The alkali-soluble resin may be a linear organic polymer, and can be appropriately selected from polymers having at least one group enhancing alkali solubility in a molecule (preferably a molecule having an acrylic copolymer or a styrene-based copolymer as a main chain).

The molecular weight of the alkali-soluble resin is not particularly determined, and the weight-average molecular weight (Mw) is preferably 5,000 to 200,000. The upper limit is preferably 100,000 or less, and more preferably 20,000 or less. Further, the number-average molecular weight (Mn) is preferably 1,000 to 20,000.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and most preferably 120 mgKOH/g or less.

From the viewpoint of heat resistance, the alkali-soluble resin is preferably a polyhydroxystyrene-based resin, a polysiloxane-based resin, an acrylic resin, an acrylamide-based resin, and an acryl/acrylamide copolymer resin are preferable, and further, from the viewpoint of controlling developability, an acrylic resin, an acrylamide-based resin, and an acryl/acrylamide copolymer resin are preferable. Examples of the group enhancing alkali solubility (hereinafter also referred to as an acid group) include a carboxyl group, a phosphoric acid group, a sulfo group, and a phenolic hydroxyl group, with the carboxyl group being preferable. The acid group may be used singly or in combination of two or more kinds thereof.

The alkali-soluble resin can be synthesized by, for example, a known radical polymerization method. Polymerization conditions such as a temperature, a pressure, the type and amount of a radical initiator, and the type of a solvent, and the like in the production of the alkali-soluble resin by a radical polymerization method can be easily set by those skilled in the art, and the conditions can also be determined experimentally.

The alkali-soluble resin is preferably a polymer having a carboxyl group in a side chain thereof, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin such as a novolac type resin, or the like; an acidic cellulose derivative having a carboxyl group in a side chain thereof; and a product obtained by adding an acid anhydride to a polymer having a hydroxyl group. In particular, a copolymer of a (meth)acrylic acid and another monomer which is copolymerizable therewith is preferable as the alkali-soluble resin. Examples of such the other monomer which is copolymerizable with the (meth)acrylic acid include the monomers described in paragraphs 0017 to 0019 of JP2015-34961A, for example, alkyl (meth)acrylate, aryl (meth)acrylate, a vinyl compound, and an N-position-substituted maleimide monomer.

Examples of the alkyl(meth)acrylate and the aryl(meth)acrylate include methyl(meth)acrylate, ethyl(meth)acrylate, propyl(meth)acrylate, butyl(meth)acrylate, isobutyl(meth)acrylate, pentyl(meth)acrylate, hexyl(meth)acrylate, octyl(meth)acrylate, phenyl(meth)acrylate, benzyl(meth)acrylate, tolyl(meth)acrylate, naphthyl(meth)acrylate, cyclohexyl(meth)acrylate, glycidyl methacrylate, and tetrahydrofurfuryl methacrylate; examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer; and examples of the N-position-substituted maleimide monomer disclosed in JP1998-300922A (JP-H10-300922A) include N-phenylmaleimide and N-cyclohexylmaleimide. Further, such the other monomer which is copolymerizable with a (meth)acrylic acid may be used singly or in combination of two or more kinds thereof.

As the alkali-soluble resin, a benzyl(meth)acrylate/(meth)acrylic acid copolymer, benzyl(meth)acrylate/(meth)acrylic acid/2-hydroxyethyl(meth)acrylate copolymer, or a multicomponent copolymer including benzyl(meth)acrylate/(meth)acrylic acid/other monomers can also be preferably used. Further, copolymers obtained by copolymerizing 2-hydroxyethyl(meth)acrylate, a 2-hydroxypropyl(meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used. In addition, as a commercially available product thereof, for example, FF-426 (manufactured by Fujikura Kasei Co., Ltd.) or the like can also be used.

Moreover, an alkali-soluble resin having a polymerizable group may be used as the alkali-soluble resin. According to this aspect, the solvent resistance of a film thus obtained tends to be improved. Examples of the polymerizable group include a (meth)allyl group and a (meth)acryloyl group. As the alkali-soluble resin having a polymerizable group, an alkali-soluble resin containing a polymerizable group on a side chain thereof, and the like are useful. Examples of the alkali-soluble resin containing a polymerizable group include DIANAL NR Series (manufactured by Mitsubishi Rayon Co., Ltd.), Photomer 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), Ebecryl 3800 (manufactured by Daicel-UCB Co., Ltd.), and ACRYCURE RD-F8 (manufactured by Nippon Shokubai Co., Ltd.).

It is also preferable that the alkali-soluble resin includes a polymer obtained by polymerizing monomer components including a compound represented by Formula (ED1) and/or a compound represented by Formula (ED2) (these compounds are hereinafter also referred to as an "ether dimer" in some cases). With regard to the polymer obtained by polymerizing monomer components including an ether dimer, reference can be made to paragraphs 0022 to 0031 of JP2015-34961A, the contents of which are incorporated herein by reference.

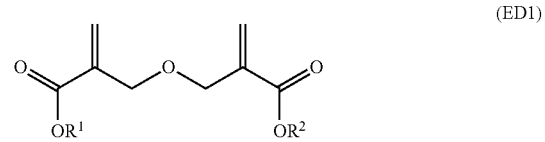

(ED1)

In Formula (ED 1), $R^1$ and $R^2$ each independently represent a hydrogen atom, or a hydrocarbon group having 1 to 25 carbon atoms, which may have a substituent.

(ED2)

In Formula (ED2), R represents a hydrogen atom or an organic group having 1 to 30 carbon atoms. With regard to the specific examples of Formula (ED2), reference can be made to the descriptions in JP2010-168539A.

With regard to the specific examples of the ether dimer, reference can be made to paragraph 0317 of JP2013-29760A, the contents of which are incorporated herein by reference. These ether dimers may be used singly or in combination of two or more kinds thereof. The structure derived from the compound represented by Formula (ED) may be copolymerized with other monomers.

The alkali-soluble resin may include a structural unit derived from a compound represented by Formula (X).

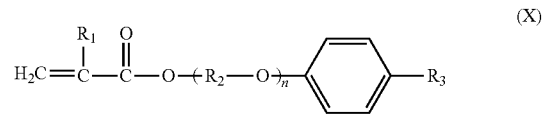

(X)

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may contain a benzene ring, and n represents an integer of 1 to 15.

In Formula (X), the number of carbon atoms of the alkylene group of $R_2$ is preferably 2 or 3. Further, the number of carbon atoms of the alkyl group of $R_3$ is 1 to 20, and more preferably 1 to 10, and the alkyl group of $R_3$ may contain a benzene ring. Examples of the alkyl group containing a benzene ring, represented by $R_3$, include a benzyl group and a 2-phenyl(iso)propyl group.

Specific examples of the alkali-soluble resin include the following resins, and also include the resins described in paragraph 0037 of JP2015-34961A.

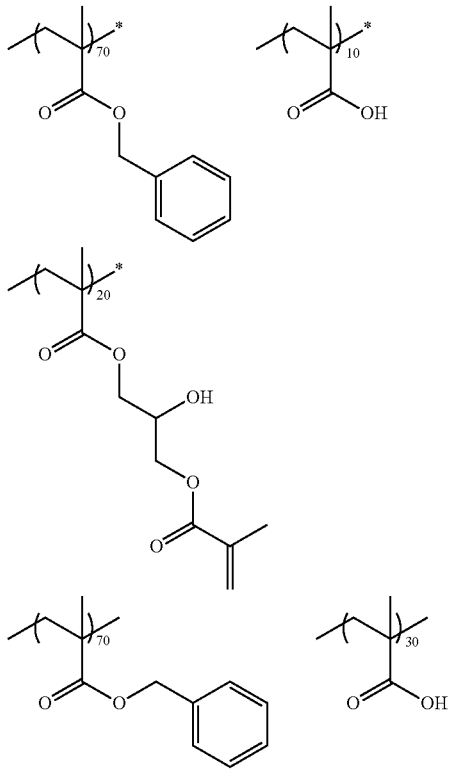

With regard to the alkali-soluble resin, reference can be made to the descriptions in paragraphs 0558 to 0571 of JP2012-208494A (<0685> to <0700> of the corresponding US2012/0235099A), the contents of which are incorporated herein by reference. Moreover, it is possible to use the copolymers (B) described in paragraph Nos. 0029 to 0063 of JP2012-32767A and the alkali-soluble resins used in Examples of the document; the binder resins described in paragraph Nos. 0088 to 0098 of JP2012-208474A and the binder resins used in Examples of the document; the binder resins described in paragraph Nos. 0022 to 0032 of JP2012-137531A and the binder resins in Examples of the document; the binder resins described in paragraph Nos. 0132 to 0143 of JP2013-024934A and the binder resins used in Examples of the document; the binder resins described in paragraph Nos. 0092 to 0098 of JP2011-242752A and used in Examples; or the binder resins described in paragraph Nos. 0030 to 0072 of JP2012-032770A, the contents of which are incorporated herein by reference.

The content of the binder is preferably 1% to 60% by mass with respect to the total solid content of the composition. The lower limit is preferably 1% by mass or more, and more preferably 5% by mass or more. The upper limit is preferably 60% by mass or less, and more preferably 50% by mass or less. The composition may include one kind or two or more kinds of the binders. In a case where the binders are used in combination of two or more kinds thereof, the total amount thereof preferably falls within a range.

(Dispersant)

The composition for use in the method for producing a film of the present invention can contain a dispersant as the resin. Examples of the dispersant include a polymer dispersant [for example, a resin having an amine group (a polyamidoamine and a salt thereof), an oligoimine-based resin, a polycarboxylic acid and a salt thereof, a high-molecular-weight unsaturated acid ester, a modified polyurethane, a modified polyester, a modified poly(meth)acrylate, a (meth) acrylic copolymer, and a naphthalene sulfonic acid/formalin condensate]. The polymer dispersants can further be classified into a linear polymer, a terminal-modified polymer, a graft-type polymer, and a block-type polymer, depending on its structure.

The dispersant preferably has a site having an adsorptive ability onto a pigment (hereinafter also totally referred to as an "adsorptive site"). Examples of the adsorptive site include a monovalent substituent having at least one group selected from the group consisting of an acid group, an urea group, an urethane group, a group having a coordinating oxygen atom, a group having a basic nitrogen atom, a heterocyclic group, an alkyloxycarbonyl group, an alkylaminocarbonyl group, a carboxyl group, a sulfonamido group, an alkoxysilyl group, an epoxy group, an isocyanate group, and a hydroxyl group. The adsorptive site is preferably an acid-based adsorptive site. Examples of the acid-based adsorptive site include an acid group. Among those, the acid-based adsorptive site is preferably at least one of a phosphorus atom-containing group or a carboxyl group. Examples of the phosphorus atom-containing group include a phosphoric acid ester group, a polyphosphoric acid ester group, and a phosphoric acid group. With regard to the details of the adsorptive site, reference can be made to paragraphs 0073 to 0080 of JP2015-34961A, the contents of which are incorporated herein by reference.

In the present invention, the resin (dispersant) is preferably a resin represented by Formula (1).

In Formula (1), $R^1$ represents a (m+n)-valent linking group, and $R^2$ represents a single bond or a divalent linking group. $A^1$ represents a monovalent substituent having at least one group selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxyl group, a sulfonamido group, an alkoxysilyl group, an epoxy group, an isocyanate group, and a hydroxyl group. n $A^1$'s and n $R^2$'s may be same or different. m represents a positive number of 8 or less, n represents an integer of 1 to 9, and m+n satisfies an integer of 3 to 10. $P^1$ represents a monovalent polymer chain. m $P^1$'s may be the same as or different from each other.

Since the substituent $A^1$ which is contained in the resin represented by Formula (1) can interact with a pigment (for example, inorganic particles such as titanium oxide), the resin represented by Formula (1) may have n (1 to 9) substituents A1's to firmly interact with a pigment (for example, inorganic particles such as titanium oxide), thereby improving the dispersity of the pigment in the composition. In addition, in the resin represented by Formula (1), m polymer chains $P^1$'s contained in the resin may serve as a steric repulsion group, and thus, such m polymer chains $P^1$'s can exhibit good steric repulsion force, and thus, uniformly disperse a pigment (for example, inorganic particles such as titanium oxide).

In Formula (1), $R^1$ represents an (m+n)-valent linking group. Examples of the (m+n)-valent linking group include a group including 1 to 100 carbon atoms, 0 to 10 nitrogen atoms, 0 to 50 oxygen atoms, 1 to 200 hydrogen atoms, and 0 to 20 sulfur atoms. Specific example of the (m+n)-valent linking group include a group constituted of one of the following structural units or a combination of the structural units (which may form a cyclic structure). With regard to the details of the (m+n)-valent linking group, reference can be made to paragraphs 0076 to 0084 of JP2007-277514A, the contents of which are incorporated herein by reference.

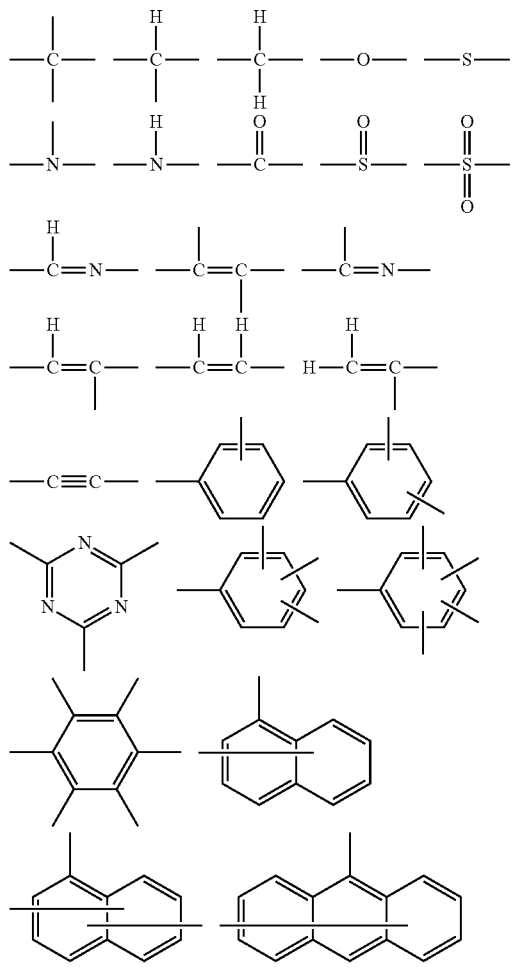

In Formula (1), $P^1$ represents a monovalent polymer chain. The monovalent polymer chain is preferably a monovalent polymer chain having a repeating unit derived from a vinyl compound. With regard to the details of the polymer chain, reference can be made to paragraphs 0087 to 0098 of JP2007-277514A, the contents of which are incorporated herein by reference.

In Formula (1), $R^2$ represents a single bond or a divalent linking group. Examples of the divalent linking group include a group including 1 to 100 carbon atoms, 0 to 10 nitrogen atoms, 0 to 50 oxygen atoms, 1 to 200 hydrogen atoms, and 0 to 20 sulfur atoms, and the divalent linking group may be unsubstituted or may further, have a substituent. Specific examples of the divalent linking group include a group constituted with one of the following structural units or a combination of two or more structural units (which may form a cyclic structure). With regard to the details of the divalent linking group, reference can be made to paragraphs 0071 to 0075 of JP2007-277514A, the contents of which are incorporated herein by reference.

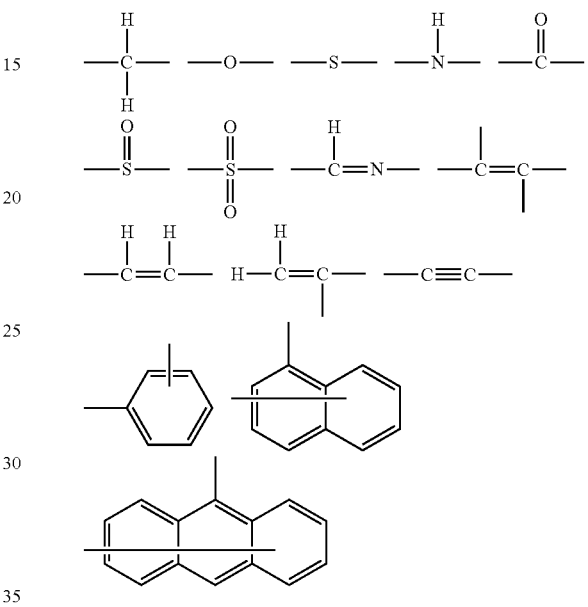

In Formula (1), $A^1$ represents a monovalent substituent having at least one selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxyl group, a sulfonamido group, an alkoxysilyl group, an epoxy group, an isocyanate group, and a hydroxyl group. With regard to details of the monovalent substituent represented by $A^1$, reference can be made to paragraphs 0041 to 0070 of JP2007-277514A, the contents of which are incorporated herein by reference.

With regard to the polymer compound represented by the Formula (1), reference can be made to the descriptions after paragraph 0039 of JP2007-277514A (<0053> of the corresponding US2010/0233595A), and the descriptions in paragraphs 0081 to 0117 of P2015-34961A, the contents of which are incorporated herein by reference.

In the present invention, as the resin (dispersant), a graft copolymer including a repeating unit represented by any one of Formulae (1) to (4) can also be used.

(1)

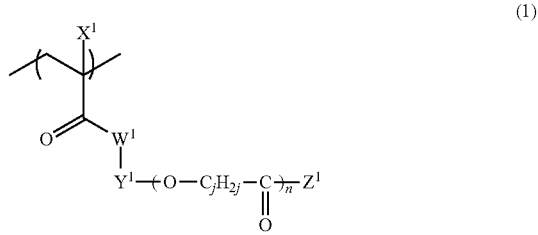

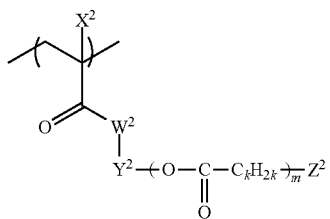

(2)

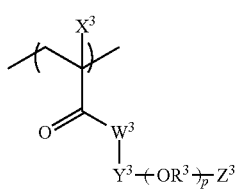

(3)

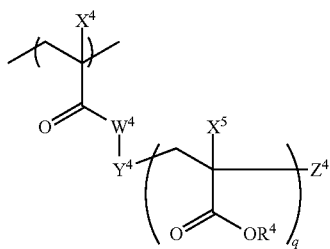

(4)

In Formulae (1) to (4), $W^1$, $W^2$, $W^3$, and $W^4$ each independently represent an oxygen atom or NH, $X^1$, $X^2$, $X^3$, $X^4$, and $X^5$ each independently represent a hydrogen atom or a monovalent organic group, $Y^1$, $Y^2$, $Y^3$, and $Y^4$ each independently represent a divalent linking group, $Z^1$, $Z^2$, $Z^3$, and $Z^4$ each independently represent a monovalent organic group, $R^3$ represents an alkylene group, $R^4$ represents a hydrogen atom or a monovalent organic group, n, m, p, and q each independently represent an integer of 1 to 500, and j and k each independently represent an integer of 2 to 8. In Formula (3), in a case where p is 2 to 500, $R^3$'s which are present in plural numbers may be the same as or different from each other, and in Formula (4), in a case where q is 2 to 500, $X^5$'s and $R^4$'s which are present in plural numbers may be the same as or different from each other.

$W^1$, $W^2$, $W^3$ and $W^4$ are each preferably an oxygen atoms. $X^1$, $X^2$, $X^3$, $X^4$, and $X^5$ are each preferably a hydrogen atom or an alkyl group having 1 to 12 carbon atoms, and are each independently more preferably a hydrogen atom or methyl group, and particularly preferably methyl groups. $Y^1$, $Y^2$, $Y^3$, and $Y^4$ each independently represent a divalent linking group, and the linking group is not particularly limited in their structures. The structure of the monovalent organic group represented by each of $Z^1$, $Z^2$, $Z^3$, and $Z^4$ is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among those, ones having the steric repulsion effect are preferable as the organic groups represented by $Z^1$, $Z^2$, $Z^3$, and $Z^4$, in particular from the viewpoint of improving the dispersibility. It is particularly preferable that and $Z^4$ each independently represent an alkyl group or an alkoxy group having 5 to 24 carbon atoms, and among these, they are each independently particularly preferably a branched alkyl group having 5 to 24 carbon atoms, a cyclic alkyl group having 5 to 24 carbon atoms, or an alkoxy group having 5 to 24 carbon atoms. In addition, the alkyl group contained in the alkoxy group may be linear, branched, or cyclic.

In Formulae (1) to (4), n, m, p, and q are each independently an integer of 1 to 500. Further, in Formulae (1) and (2), j and k each independently represent an integer of 2 to 8. j and k in Formulae (1) and (2) are preferably an integer of 4 to 6, and most preferably 5, from the viewpoint of dispersion stability or developability.

In Formula (3), $R^3$ represents an alkylene group, and is preferably an alkylene group having 1 to 10 carbon atoms, and more preferably an alkylene group having 2 or 3 carbon atoms. In a case where p is 2 to 500, $R^3$'s which are present in plural numbers may be the same as or different from each other.

In Formula (4), $R^4$ represents a hydrogen atom or a monovalent organic group, and the monovalent organic group is not particularly limited in terms of its structure. $R^4$ is preferably a hydrogen atom, an alkyl group, an aryl group, or a heteroaryl group, and more preferably a hydrogen atom or an alkyl group. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is particularly preferable. In Formula (4), in a case where q is 2 to 500, $X^5$'s and $R^4$'s which are present in plural numbers in a graft copolymer may be the same as or different from each other.

With regard to the graft copolymer, reference can be made to the descriptions in paragraph Nos. 0025 to 0094 of JP2012-255128A, the contents of which are incorporated herein by reference. Specific examples of the graft copolymer include the following resins. Other examples thereof include the resins described in paragraph Nos. 0072 to 0094 of JP2012-255128A, the contents of which are incorporated herein by reference.

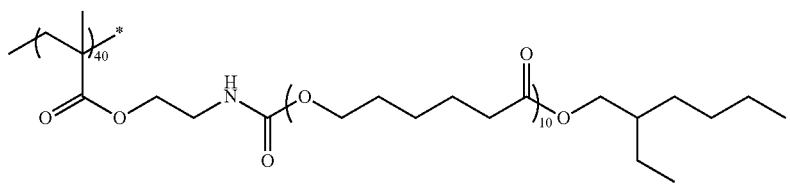

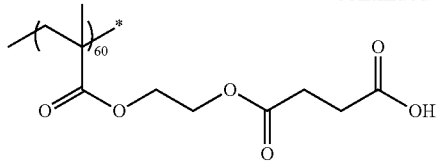

In the present invention, as the resin (dispersant), an oligoimine-based dispersant having a nitrogen atom in at least one of the main chain or a side chain is also preferable. As the oligoimine-based dispersant, a resin including a repeating unit having a partial structure X having a functional group with a pKa of 14 or less and a side chain including an oligomer chain or polymer chain Y having 40 to 10,000 atoms, and having a basic nitrogen atom in at least one of the main chain or the side chain is preferable. This resin interacts with a pigment (for example, inorganic particles such as titanium oxide) at both a nitrogen atom and a functional group contained in the partial structure X, with a pKa of 14 or less, and the resin has an oligomer chain or polymer chain Y having 40 to 10,000 atoms. Therefore, for example, the oligomer chain or polymer chain Y functions as a sterically repulsive group and thus exhibits good dispersibility, and thus, inorganic particles such as titanium oxide can be uniformly dispersed. Further, the oligomer chain or polymer chain Y interacts with a solvent, and thus, sedimentation of inorganic particles such as titanium oxide can be suppressed for a long period of time. In addition, the oligomer chain or polymer chain Y functions as a sterically repulsive group, and thus, aggregation of a pigment (for example, inorganic particles such as titanium oxide) is prevented, and therefore, even in a case where the content of the pigment (preferably inorganic particles such as titanium oxide) is increased, excellent dispersibility is obtained.

Here, the basic nitrogen atom is not particularly limited as long as it is a nitrogen atom exhibiting basicity, but the resin preferably contains a structure having a nitrogen atom with a pKb of 14 or less, and more preferably contains a structure having a nitrogen atom with a pKb of 10 or less. In the present invention, the $pK_b$ (base strength) refers to a pKb at a water temperature of 25° C., is one of the indices for quantitatively representing the intensity of a base, and has the same definition as the basicity constant. The base strength pKb and the acid strength pKa are in a relationship of pKb=14-pKa.

The functional group with a pKa of 14 or less contained in the partial structure X is not particularly limited, and its structure or the like is not particularly limited as long as the physical properties satisfy the condition. The functional group with a pKa of 12 or less is particularly preferable, and the functional group with a pKa of 11 or less is most preferable. Specific examples of the functional group include a carboxyl group (pKa: approximately 3 to 5), a sulfo group (pKa: approximately −3 to −2), a —COCH$_2$CO— group (pKa: approximately 8 to 10), a —COCH$_2$CN group (pKa: approximately 8 to 11), a —CONHCO— group, a phenolic hydroxyl group, a —R$_F$CH$_2$OH group, or a —(R$_F$)$_2$CHOH group (R$_F$ represents a perfluoroalkyl group, pKa: approximately 9 to 11), and a sulfonamido group (pKa: approximately 9 to 11). The partial structure X having a functional group with a pKa of 14 or less preferably is directly bonded to a basic nitrogen atom in a repeating unit containing a nitrogen atom, but the basic nitrogen atom of the repeating unit containing a basic nitrogen atom and the partial structure X may be linked to each other via a covalent bond as well as an ion bond such that a salt is formed.

The oligoimine-based dispersant is preferably a resin having a repeating unit containing a basic nitrogen atom to which the partial structure X having a functional group with a pKa of 14 or less is bonded, and an oligomer chain or polymer chain Y having 40 to 10,000 atoms in a side chain.

Furthermore, the oligoimine-based dispersant is preferably a resin which has (i) at least one repeating unit having a basic nitrogen atom, selected from a poly(lower alkylenimine)-based repeating unit, a polyallylamine-based repeating unit, a polydiallylamine-based repeating unit, a metaxylenediamine-epichlorohydrin polycondensate-based repeating unit, and a polyvinylamine-based repeating unit, in which the repeating unit is bonded to the basic nitrogen atom and has a partial structure X having a functional group with a pKa of 14 or less, and (ii) an oligomer chain or polymer chain Y having 40 to 10,000 atoms in a side chain. Further, in the present invention, the "lower" in the poly(lower alkylenimine) represents that the number of carbon atoms is 1 to 5, and a lower alkylenimine represents an alkylenimine having 1 to 5 carbon atoms.

Examples of the oligomer chain or polymer chain Y having 40 to 10,000 atoms include known polymer chains such as a polyester, a polyamide, a polyimide, and a poly(meth)acrylic acid ester, which can be linked to the main chain portion of the resin. The binding site in the oligomer chain or polymer chain Y to the resin is preferably the terminal of the oligomer chain or polymer chain Y.

The oligomer chain or polymer chain Y is preferably bonded to the nitrogen atom in at least one repeating unit containing a basic nitrogen atom, selected from a poly(lower alkylenimine)-based repeating unit, a polyallylamine-based repeating unit, a polydiallylamine-based repeating unit, a metaxylenediamine-epichlorohydrin polycondensate-based repeating unit, and a polyvinylamine-based repeating unit. The bonding mode between the main chain portion of a repeating unit which has at least one repeating unit containing a basic nitrogen atom, selected from a poly(lower alkylenimine)-based repeating unit, a polyarylamine-based repeating unit, a polydiarylamine-based repeating unit, a metaxylenediamine-epichlorohydrin polycondensate-based repeating unit, and a polyvinylamine-based repeating unit, and Y is a covalent bond, an ionic bond, or a mixture of the covalent bond and the ionic bond. The ratio of the bonding mode between Y and the main chain section in terms of covalent bonds:ionic bonds is preferably 100:0 to 0:100, and more preferably 95:5 to 5:95. Y is preferably bonded to a nitrogen atom of a repeating unit containing the nitrogen atom via an amide bond, or via an ionic bond as a carboxylate.

From the point of view of the dispersibility, the dispersion stability and the developing property, the number of atoms of the oligomer chain or polymer chain Y is preferably 50 to 5,000, and more preferably 60 to 3,000. In addition, it is possible to measure the number-average molecular weight of Y using a value in terms of polystyrene according to a GPC method. The number-average molecular weight of Y is preferably 1,000 to 50,000, and more preferably 1,000 to 30,000.

Examples of the oligoimine-based dispersant include a resin including a repeating unit represented by Formula (I-1), a repeating unit represented by Formula (I-2), and/or a repeating unit represented by Formula (I-2a).

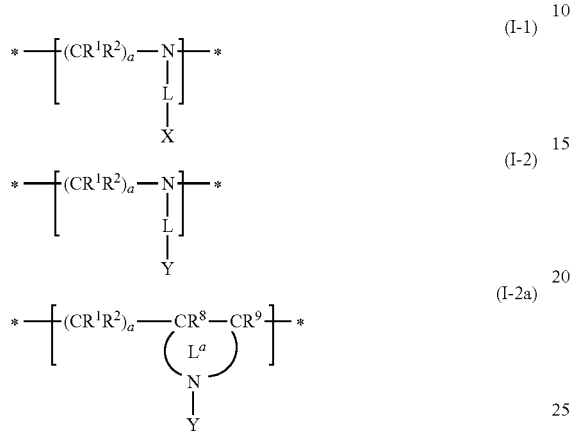

$R^1$ and $R^2$ each independently represent a hydrogen atom, a halogen atom or an alkyl group (which preferably has 1 to 6 carbon atoms).

a each independently represents an integer from 1 to 5. * represents a linking moiety between the repeating units.

$R^8$ and $R^9$ are each independently a group having the same meaning as $R^1$.

L is a single bond, an alkylene group (which preferably has 1 to 6 carbon atoms), an alkenylene group (which preferably has 2 to 6 carbon atoms), an arylene group (which preferably has 6 to 24 carbon atoms), a heteroarylene group (which preferably has 1 to 6 carbon atoms), an imino group (which preferably has 0 to 6 carbon atoms), an ether group, a thioether group, a carbonyl group, or a linking group which is related to a combination thereof. Among these, a single bond or —$CR^5R^6$—$NR^7$— (an imino group bonds with X or Y) is preferable. Here, $R^5$ and $R^6$ each independently represent a hydrogen atom, a halogen atom or an alkyl group (which preferably has 1 to 6 carbon atoms). $R^7$ is a hydrogen atom or an alkyl group which has 1 to 6 carbon atoms.

$L^a$ is a structural site which forms a ring structure along with $CR^8CR^9$ and N, and is preferably a structural site which forms a non-aromatic heterocycle which has 3 to 7 carbon atoms along with the carbon atoms of $CR^8CR^9$. A structural site which forms a non-aromatic heterocycle which has 5 to 7 members along with the carbon atoms of $CR^8CR^9$ and N (a nitrogen atom) is more preferable, a structural site which forms a non-aromatic heterocycle which has 5 members is even more preferable, and a structural site which forms pyrrolidine is particularly preferable. Here, the structural site may further, have a substituent such as an alkyl group. X represents a group which has a functional group with a pKa of 14 or less. Y represents an oligomer chain or polymer chain which has 40 to 10,000 atoms.

The dispersant (oligoimine-based dispersant) may further, contain one or more selected from repeating units represented by Formulae (I-3), (I-4), and (I-5) as a copolymerization component. It is possible to further improve the dispersibility of the pigment by incorporating such a repeating unit into the dispersant.

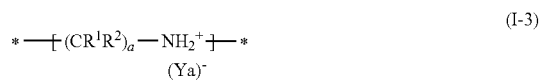

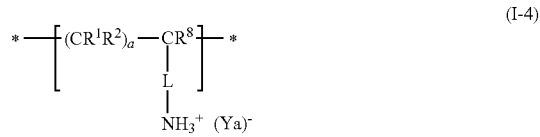

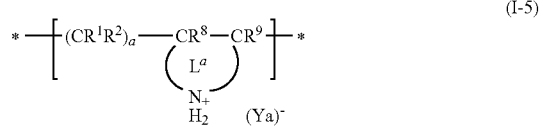

$R^1$, $R^2$, $R^8$, $R^9$, L, $L^a$, a, and * have the same definitions as in Formulae (I-1), (I-2), and (I-2a). Ya represents an oligomer chain or polymer chain having 40 to 10,000 atoms, which has an anion group.

With regard to the oligoimine-based dispersant, reference can be made to the descriptions in paragraph Nos. 0118 to 0190 of JP2015-34961A, the contents of which are incorporated herein by reference. As specific examples of the oligoimine-based dispersant, for example, the following resins or the resins described in paragraph Nos. 0169 to 0190 of JP2015-34961A can be used.

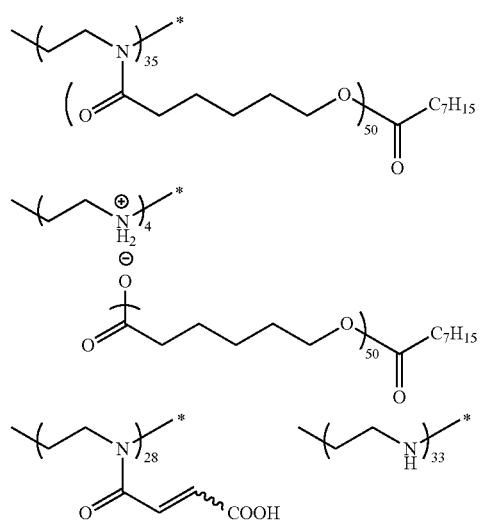

The dispersant can also be available as a commercially available product, and specific examples thereof include "Disperbyk-101 (polyamidoamine phosphate), 107 (carboxylate ester), 110 and 180 (a copolymer which includes an acid group), 130 (polyamide), 161, 162, 163, 164, 165, 166, and 170 (high molecular copolymer)", and "BYK-P104 and P105 (high-molecular-weight unsaturated polycarboxylic acid)" manufactured by BYK Chemie Co., Ltd., "EFKA 4047, 4050, 4010, and 4165 (polyurethane-based), EFKA 4330 and 4340 (block copolymers), 4400 and 4402 (modified polyacrylate), 5010 (polyesteramide), 5765 (high-molecular-weight polycarboxylate), 6220 (fatty acid polyester), 6745 (phthalocyanine derivative), and 6750 (azo pigment derivative)" manufactured by EFKA Ltd., "AJISPER PB821 and PB822" manufactured by Ajinomoto Fine-Techno Co., Inc., "FLOWREN TG-710 (urethane oligomer)" and "POLYFLOW No. 50E and No. 300 (acrylic copolymer)"

manufactured by Kyoeisha Chemical Co., Ltd., "DISPARLON KS-860, 873SN, 874, and #2150 (aliphatic polycarboxylic acid), #7004 (polyetherester), DA-703-50, DA-705, and DA-725" manufactured by Kusumoto Chemicals, Ltd., "DEMOL RN and N (naphthalenesulfonic acid formalin polycondensate), and MS, C, and SN-B (aromatic sulfonic acid/formalin polycondensate)", "HOMOGENOL L-18 (high molecular polycarboxylic acid)", "EMULGEN 920, 930, 935, and 985 (polyoxyethylene nonyl phenyl ether)" and "ACETAMIN 86 (stearylamine acetate)" manufactured by Kao Corp., "Solsperse 5000 (phthalocyanine derivative), 22000 (azo pigment derivative), 13240 (polyester amine), 3000, 17000, and 27000 (polymers which have a functional section in the terminal), 24000, 26000, 28000, 32000, 36000, and 385000 (graft-type polymer), and 41000" manufactured by Lubrizol Corp., "NIKKOL T106 (polyoxyethylene sorbitan monooleate), and MYS-IEX (polyoxyethylene monostearate)" manufactured by Nikko Chemicals Co., Ltd., and the like.

In addition, examples of the commercially available product of the dispersant having a phosphorus atom-containing group (for example, a phosphoric acid group) as an acid-based adsorptive site include "Solsperse 26000, 36000, and 41000" manufactured by Lubrizol Japan Ltd., which can be appropriately used The dispersants can be used singly or in combination of two or more kinds thereof.

The content of the dispersant is preferably 0.1% to 40% by mass. The upper limit is preferably 20% by mass or less, and more preferably 10% by mass or less, with respect to the total solid content of the composition. The lower limit is preferably 0.5% by mass or more, and more preferably 1% by mass or more.

Furthermore, the content of the dispersant is preferably 1 to 100 parts by mass with respect to 100 parts by mass of the pigment. The upper limit is preferably 80 parts by mass or less, and more preferably 60 parts by mass or less. The lower limit is preferably 2.5 parts by mass or more, and more preferably 5 parts by mass or more.

Furthermore, the content of the dispersant is preferably 1 to 100 parts by mass with respect to 100 parts by mass of the inorganic pigment. The upper limit is preferably 80 parts by mass or less, and more preferably 60 parts by mass or less. The lower limit is preferably 2.5 parts by mass or more, and more preferably 5 parts by mass or more.

In addition, the content of the dispersant is preferably 1 to 100 parts by mass with respect to 100 parts by mass of titanium oxide. The upper limit is preferably 80 parts by mass or less, and more preferably 60 parts by mass or less. The lower limit is preferably 2.5 parts by mass or more, and more preferably 5 parts by mass or more.

<<Solvent>>

The composition for use in the method for producing a film of the present invention contains a solvent. The solvent can be constituted with various organic solvents. Examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These organic solvents may be used individually or as a mixture.

In the present invention, a solvent having a small metal content is preferably used as the solvent. The metal content of the solvent is preferably, for example, 10 ppb or less. As desired, a solvent having a metal content at a ppt level may be used, and such a high-purity solvent is provided by, for example, Toyo Gosei Co., Ltd. (The Chemical Daily (Kagaku Kogyo Nippo), Nov. 13, 2015).

Examples of a method for removing impurities such as metals from the solvent include distillation (molecular distillation, thin film distillation, or the like) and filtration using a filter. As for the filter pore diameter of the filter used for the filtration, the pore size is preferably 10 nm or less, more preferably 5 nm or less, and still more preferably 3 nm or less. As for the materials of a filter, a polytetrafluoroethylene-made filter, a polyethylene-made filter, or a nylon-made filter is preferable.

The solvent may include isomers (compounds having the same number of atoms and different structures). Further, one kind or a plurality of kinds of the isomers may be included.

The content of the solvent is preferably a content such that the concentration of the solid content of the composition reached 25% to 70% by mass. The upper limit is more preferably 60% by mass or less. The lower limit is more preferably 30% by mass or more. In a case where the concentration of the solid content of the composition falls with the range the coatability and the coating unevenness of the composition can be improved.

<<Polymerizable Compound>>

The composition for use in the method for producing a film of the present invention preferably contains a polymerizable compound. The polymerizable compound is preferably a compound having at least one ethylenically unsaturated double bond, and more preferably a compound having at least one terminal ethylenically unsaturated bond, or preferably two or more terminal ethylenically unsaturated bonds. Further, the polymerizable compound is preferably a compound having 6 or more ethylenically unsaturated double bonds, more preferably a compound having 3 or 4 ethylenically unsaturated double bonds, and still more preferably a compound having 3 or 4 ethylenically unsaturated double bonds. The ethylenically unsaturated bond is preferably a (meth)acryloyl group or a (meth)acryloyloxy group. In addition, the polymerizable compound is preferably a radically polymerizable compound.

The polymerizable compound may be in any form of a monomer and a polymer, with the monomer being preferable. The monomer-type polymerizable compound preferably has a molecular weight of 100 to 3,000. The upper limit is preferably 2,000 or less, and more preferably 1,500 or less. The lower limit is preferably 150 or more, and more preferably 250 or more.

The polymerizable compound is preferably a trifunctional to pentadecafunctional (meth)acrylate compound, more preferably a trifunctional to hexafunctional (meth)acrylate compound, and still more preferably a trifunctional or tetrafunctional (meth)acrylate compound. According to this aspect, the solvent resistance of the obtained film or the adhesiveness to a substrate can be improved. Further, the polymerizable compound is preferably a hexafunctional or higher (meth)acrylate compound.

The polymerizable compound is preferably a compound which has at least one addition-polymerizable ethylene group, which is a compound having an ethylenically unsaturated group, with a boiling point of 100° C. or higher at normal pressure. Examples thereof include monofunctional acrylates or methacrylates such as polyethylene glycol mono (meth)acrylate, polypropylene glycol mono(meth)acrylate, and phenoxyethyl (meth)acrylate; polyethylene glycol di(meth)acrylate, trimethylolethane tri(meth)acrylate, neopentyl glycol di(meth)acrylate, pentaerythritol tri(meth) acrylate, pentaerythritol tetra(meth)acrylate, dipentaerythritol penta(meth)acrylate, dipentaerythritol hexa(meth) acrylate, hexanediol(meth)acrylate, trimethylolpropane tri (acryloyloxypropyl) ether, tri(acryloyloxyethyl) isocyanurate, and a mixture thereof, and the polymerizable compound is preferably pentaerythritol tetra(meth)acrylate.

As the polymerizable compound, the polymerizable compounds represented by Formulae (MO-1) to (MO-5) can be suitably used. Further, in a case where T is an oxyalkylene group in the formula, a terminal on the side of the carbon atom is bonded to R.

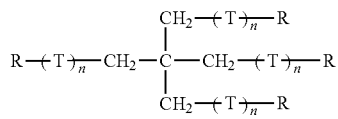
(MO-1)

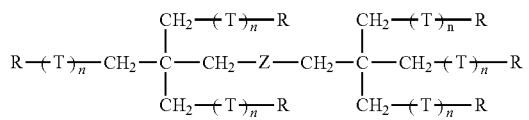
(MO-2)

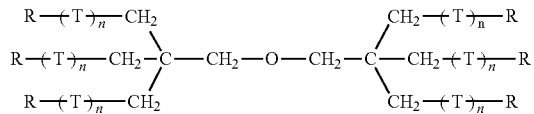
(MO-3)

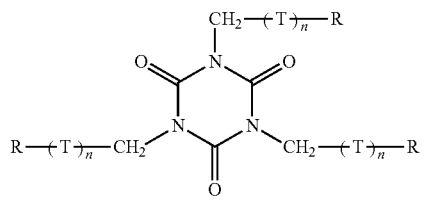
(MO-4)

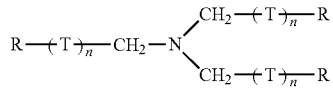
(MO-5)

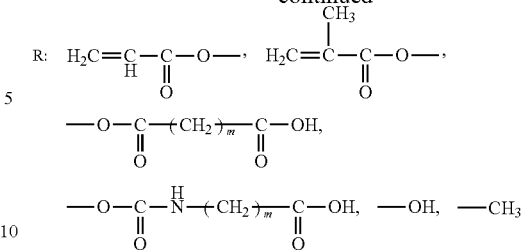

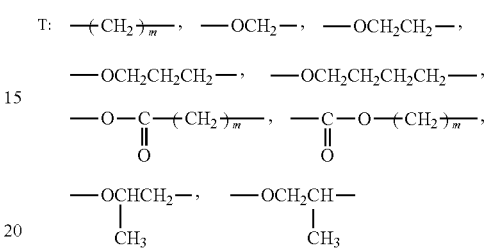

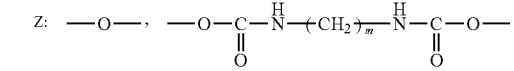

In the formulae, n is an integer of 0 to 14, and m is an integer of 1 to 8. A plurality of R's and T's which are present in the same molecule may be the same as or different from each other.

In each of the polymerizable compounds represented by Formulae (MO-1) to (MO-5), at least one of the plurality of R's represents a group represented by —OC(=O)CH=CH$_2$ or —OC(=O)C(CH$_3$)=CH$_2$.

Specific examples of the polymerizable compounds represented by Formulae (MO-1) to (MO-5) include the compounds described in paragraphs 0248 to 0251 of JP2007-269779A.

Furthermore, a compound obtained by adding ethylene oxide or propylene oxide to a polyfunctional alcohol, followed by (meth)acrylation, which is described in JP1998-62986A (JP-H10-62986A), can be used as the polymerizable compound.

As the polymerizable compound, pentaerythritol tetraacrylate (A-TMMT as a commercially available product; manufactured by Shin-Nakamura Chemical Co., Ltd.), dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth) acrylate (KAYARAD D-310 as a commercially available product; manufactured by Nippon Kayaku Co., Ltd.), or dipentaerythritol hexa(meth)acrylate (KAYARAD DPHA as a commercially available product; manufactured by Nippon Kayaku Co., Ltd.) is preferable, and a pentaerythritol tetraacrylate is more preferable.

The polymerizable compound may have an acid group such as a carboxyl group, a sulfonic acid group, and a phosphoric acid group. The polymerizable compound having an acid group is obtained by a method including (meth) acrylating a hydroxyl group in a part of a polyhydric alcohol, and subjecting the remaining hydroxyl group to an addition reaction with an acid anhydride to form a carboxyl group, or the like. Examples of the compound having an acid group include an ester of an aliphatic polyhydroxy compound with an unsaturated carboxylic acid. The polymerizable compound having an acid group is preferably an ester of an aliphatic polyhydroxy compound with an unsaturated carboxylic acid, and more preferably a polymerizable compound in which a non-aromatic carboxylic acid anhydride is reacted with an unreacted hydroxyl group of the aliphatic polyhydroxy compound to make an acid group bonded thereto. Particularly preferably in this ester, the aliphatic polyhydroxy compound is pentaerythritol and/or dipentaerythritol. Examples of the commercially available product thereof include ARONIX series M-305, M-510, and M-520 as a polybasic modified acryl oligomer manufactured by TOAGOSEI, CO., LTD. The acid value of the polymerizable compound having an acid group is preferably 0.1 to 40 mgKOH/g. The lower limit is preferably 5 mgKOH/g or more. The upper limit is preferably 30 mgKOH/g or less.

It is also a preferred aspect that the polymerizable compound is a compound having a caprolactone structure. The polymerizable compound having a caprolactone structure is not particularly limited as long as it has a caprolactone structure in a molecule thereof, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among those, the polymerizable compound having a caprolactone structure is preferably a compound represented by Formula (Z-1).

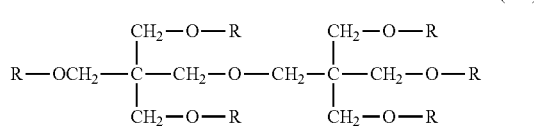
(Z-1)

In Formula (Z-1), all of six R's are a group represented by Formula (Z-2). Alternatively, one to five out of six R's are a group represented by Formula (Z-2), and the remainder is a group represented by Formula (Z-3).

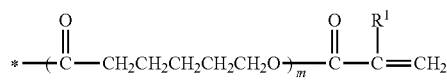
(Z-2)

In Formula (Z-2), $R^1$ represents a hydrogen atom or a methyl group, m represents an integer 1 or 2, and "*" represents a binding arm.

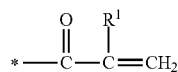
(Z-3)

In Formula (Z-3), R1 represents a hydrogen atom or a methyl group, and "*" represents a binding arm.

The polymerizable compound having a caprolactone structure is commercially available as a KAYARAD DPCA series from Nippon Kayaku Co., Ltd., and examples thereof include DPCA-20 (a compound in which m is 1, the number of the groups represented by Formula (Z-2) is 2, and all of $R^1$'s are hydrogen atoms in Formulae (Z-1) to (Z-3)), DPCA-30 (a compound in which m is 1, the number of the groups represented by Formula (Z-2) is 3, and all of $R^1$'s are hydrogen atoms in Formulae (Z-1) to (Z-3)), DPCA-60 (a compound in which m is 1, the number of the groups represented by Formula (Z-2) is 6, and all of $R^1$'s are hydrogen atoms in Formulae (Z-1) to (Z-3)), and DPCA-120 (a compound in which m is 2, the number of the groups represented by Formula (Z-2) is 6, and all of $R^1$'s are hydrogen atoms in Formulae (Z-1) to (Z-3)).

As the polymerizable compound, a compound represented by Formula (Z-4) or (Z-5) can also be used.

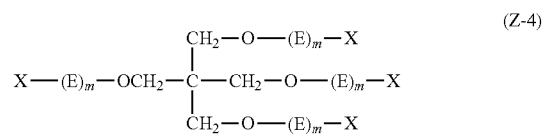
(Z-4)

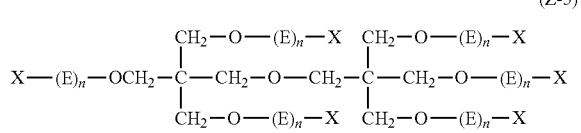
(Z-5)

In Formulae (Z-4) and (Z-5), E's each independently represent $-((CH_2)_yCH_2O)-$ or $-((CH_2)_yCH(CH_3)O)-$, y's each independently represent an integer of 0 to 10, and X's each independently represent a (meth)acryloyl group, a hydrogen atom, or a carboxyl group.

In Formula (Z-4), the sum of the (meth)acryloyl groups is 3 or 4, m's each independently represent an integer of 0 to 10, and the sum of the respective m's is an integer of 0 to 40.

In Formula (Z-5), the sum of the (meth)acryloyl groups is 5 or 6, n's each independently represent an integer of 0 to 10, and the sum of the respective n's is an integer of 0 to 60.

In Formula (Z-4), m is preferably an integer of 0 to 6, and more preferably an integer of 0 to 4.

Furthermore, the sum of the respective m's is preferably an integer of 2 to 40, more preferably an integer of 2 to 16, and particularly preferably an integer of 4 to 8.

In Formula (Z-5), n is preferably an integer of 0 to 6, and more preferably an integer of 0 to 4.

Furthermore, the sum of the respective n's is preferably an integer of 3 to 60, more preferably an integer of 3 to 24, and particularly preferably an integer of 6 to 12.

In addition, $-((CH_2)_yCH_2O)-$ or $-((CH_2)_y CH(CH_3)O)-$ in Formula (Z-4) or (Z-5) is preferably in the form in which the terminal at an oxygen atom side binds to X.

The compound represented by Formula (Z-4) or (Z-5) may be used singly or in combination of two or more kinds thereof. In particular, a form in which all of six X's in Formula (Z-5) are acryloyl groups are preferable.

Moreover, the total content of the compound represented by Formula (Z-4) or (Z-5) in the polymerizable compound is preferably 20% by mass or more, and more preferably 50% by mass or more.

The compound represented by Formula (Z-4) or (Z-5) can be synthesized by steps known in the related art, which includes a step of bonding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, a person skilled in the art can easily synthesize the compound represented by Formula (Z-4) or (Z-5).

Among the compounds represented by Formula (Z-4) or (Z-5), a pentaerythritol derivative and/or a dipentaerythritol derivative is/are more preferable.

Specific examples of the compounds include compounds represented by Formulae (a) to (f) (hereinafter also referred to as "exemplary compounds (a) to (f)"). Among those, the exemplary compounds (a), (b), (e), and (f) are preferable.

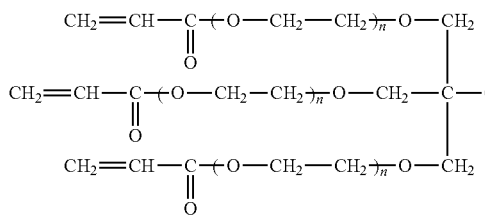
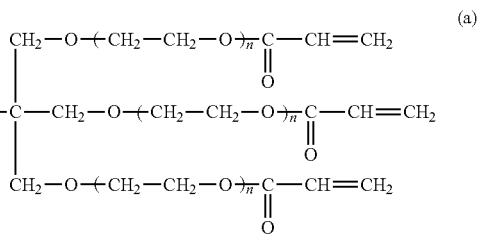

(a)

(the sum of the respective n's is 6)

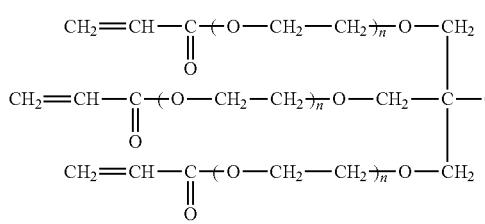
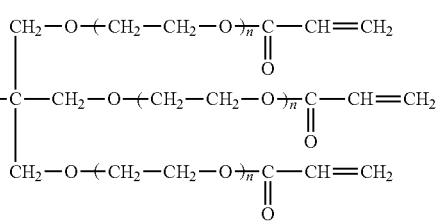

(b)

(the sum of the respective n's is 12)

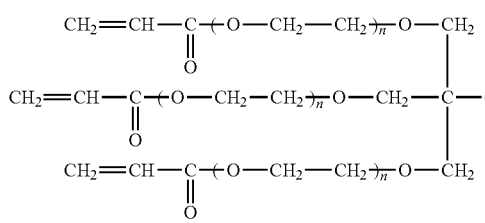
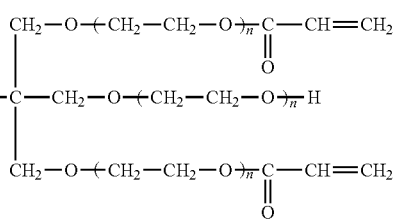

(c)

(the sum of the respective n's is 12)

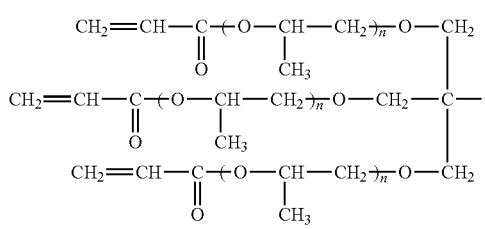
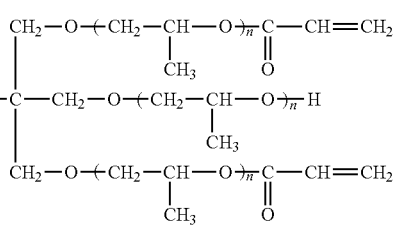

(d)

(the sum of the respective n's is 6)

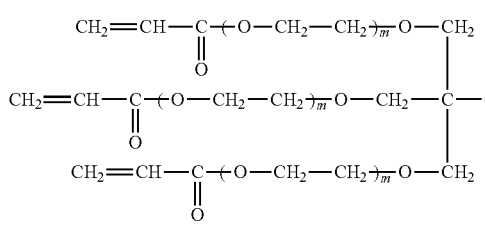

(e)

(the sum of the respective m's is 4)

-continued

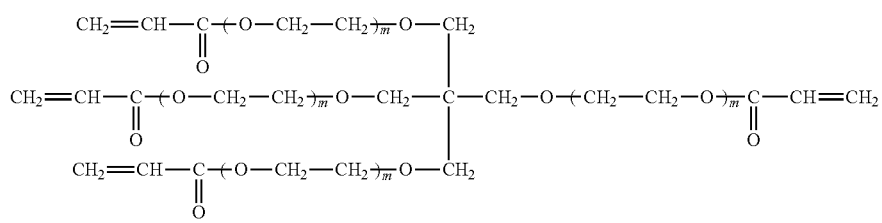

(f)

(the sum of the respective m's is 12)

Examples of the commercially available product of the polymerizable compound represented by Formula (Z-4) or (Z-5) include SR-494 which is a tetrafunctional acrylate having four ethyleneoxy chains, manufactured by Sartomer, and DPCA-60 which is a hexafunctional acrylate having six pentyleneoxy chains, and TPA-330 which is a trifunctional acrylate having three isobutyleneoxy chains, manufactured by Nippon Kayaku Co., Ltd.

As the polymerizable compound, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also suitable. In addition, the addition-polymerizable compounds having an amino structure or a sulfide structure in a molecule, which are described in JP1988-277653A (JP-S63-277653A), JP1988-260909A (JP-S63-260909A), and JP1989-105238A (JP-H01-105238A), are also preferable.

Examples of commercially available products of the polymerizable compound include urethane oligomers UAS-10 and UAB-140 (manufactured by Sanyo-Kokusaku Pulp, Co., Ltd.), U-4HA, U-6LPA, UA-32P, U-10HA, U-10PA, UA-122P, UA-1100H, and UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, and AI-600 (manufactured by Kyoeisha Chemical Co., Ltd.), and UA-9050 and UA-9048 (manufactured by BASF).

As for these polymerizable compounds, details of the method of use such as the structure of the compounds, single use or use of a combination, and the amount to be added may be arbitrarily set in accordance with the final performance design of the curable compositions. For example, the details of the method are selected from the following viewpoint. From the viewpoint of sensitivity, a structure having a high content of unsaturated groups per one molecule is preferable, and in many cases, bifunctionality or higher functionality is preferred. Further, in order to increase the strength of a cured film, a trifunctional or higher compound is desirable, and in addition, it is effective to use a method of controlling both the sensitivity and the strength by using compounds having different functionalities and/or different polymerizable groups (for example, acrylic acid ester, methacrylic acid ester, styrene-based compound and vinyl ether-based compound) in combination. In addition, it is also preferable to use another polymerizable compound which is a trifunctional or higher compound and is in an ethylene oxide chain form. According to this aspect, it is possible to form a pattern having controllable and excellent developability of the composition. Further, the selection and/or the method of use of the polymerizable compounds are also important factors for the compatibility with other components (for example, a photopolymerization initiator and a resin) contained in the composition and/or for the dispersibility, and for example, the compatibility or the like can be improved by using a low-purity compound or using a combination of two or more kinds of other components.

The content of the polymerizable compound is preferably 1% to 50% by mass with respect to the total solid content of the composition. The lower limit is preferably 3% by mass or more, and more preferably 5% by mass or more. The upper limit is more preferably 40% by mass or less, and still more preferably 30% by mass or less.

<<Photopolymerization Initiator>>

The composition for use in the method for producing a film of the present invention can contain a photopolymerization initiator. In particular, in a case where the composition includes a polymerizable compound, it is preferable that the composition contains a photopolymerization initiator. The photopolymerization initiator is not particularly limited, and can be appropriately selected from known photopolymerization initiators. For example, a photopolymerization initiator having photosensitivity with respect to light rays in a range ranging from an ultraviolet region to visible light is preferable. Further, the photopolymerization initiator is preferably a photoradical polymerization initiator. In addition, it is preferable that the photopolymerization initiator contains at least one compound having at least a molar light absorption coefficient of about 50 in a range from about 300 nm to 800 nm (more preferably 330 nm to 500 nm).

Examples of the photopolymerization initiator include halogenated hydrocarbon derivatives (for example, a derivative having a triazine skeleton and a derivative having an oxadiazole skeleton), acylphosphine compounds such as acylphosphine oxide, hexaaryl biimidazole, oxime compounds such as an oxime derivative, organic peroxide, thio compounds, ketone compounds, aromatic onium salts, ketoxime ethers, aminoacetophenone compounds, and hydroxyacetophenone. Examples of the halogenated hydrocarbon compound having a triazine skeleton include the compounds described in Wakabayashi et al., Bull. Chem. Soc. Japan, 42, 2924 (1969), the compounds described in UK1388492B, the compound described in JP1978-133428A (JP-553-133428A), the compounds described in GE3337024B, the compounds described in F. C. Schaefer et al., J. Org. Chem.; 29, 1527 (1964), the compounds described in JP1987-58241A (JP-562-58241A), the compounds described in JP1993-281728A (JP-H05-281728A), the compounds described in JP1993-34920A (JP-H05-34920A), and the compounds described in U.S. Pat. No. 4,212,976A.

Furthermore, from the viewpoint of exposure sensitivity, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triallyl imidazole dimer, an onium compound, a benzothiazole compound, a benzophenone compound, an acetophenone compound, and derivatives of these, a cyclopentadiene-benzene-iron complex and a salt thereof, a halomethyl oxadiazole compound, and a 3-aryl-substituted coumarin compound is preferable.

As the photopolymerization initiator, a hydroxyacetophenone compound, an aminoacetophenone compound, and an acylphosphine compound can also suitably be used. More specifically, for example, the aminoacetophenone-based initiators described in JP1998-291969A (JP-H10-291969A) and the acylphosphine-based initiators described in JP4225898B can also be used. As the hydroxyacetophenone-based initiator, IRGACURE 184, DAROCUR-1173, IRGACURE 500, IRGACURE 2959, and IRGACURE 127 (trade names: all manufactured by BASF) can be used. As the aminoacetophenone-based initiator, IRGACURE 907, IRGACURE 369, IRGACURE 379, and IRGACURE 379EG (trade names: all manufactured by BASF) which are commercially available products can be used. In addition, as the aminoacetophenone-based initiator, the compound described in JP2009-191179A, of which an absorption wavelength matches with a light source of a long wavelength of 365 nm, 405 nm, or the like can also be used.

IRGACURE 819 or IRGACURE TPO (trade name: both manufactured by BASF) which are commercially available products can be used as the acylphosphine-based initiator.

From the viewpoint of coloration after exposure, an acylphosphine-based initiator is preferable.

As the photopolymerization initiator, an oxime compound can be preferably used. As the specific examples of the oxime compounds, the compound described in JP2001-233842A, the compound described in JP2000-80068A, or the compound described in JP2006-342166A can be used.

Examples of the oxime compound which can be suitably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. Furthermore, examples of the oxime compound also include the compounds described in J. C. S. Perkin II (1979), pp. 1653-1660, J. C. S. Perkin II (1979), pp. 156-162, Journal of Photopolymer Science and Technology (1995), pp. 202-232, and each publication of JP2000-66385A, JP2000-80068A, JP2004-534797A, and JP2006-342166A, and the like. As the commercially available products thereof, IRGACURE OXE01 (manufactured by BASF) and IRGACURE OXE02 (manufactured by BASF) are also suitably used. In addition, TR-PBG-304 (manufactured by Changzhou Tronly New Electronic Materials Co., Ltd.), and ADEKA ARKLS NCI-930 (manufactured by ADEKA Corporation) can also be used.

Furthermore, as oxime compounds other than the above, the compounds described in JP2009-519904A in which oxime is linked to an N-position of carbazole, the compounds described in U.S. Pat. No. 7,626,957B in which a hetero-substituent is introduced into a benzophenone moiety, the compounds described in JP2010-15025A and US2009/292039A in which a nitro group is introduced into a coloring agent moiety, the ketoxime compounds described in WO2009/131189A, the compounds described in U.S. Pat. No. 7,556,910B, which contain a triazine skeleton and an oxime skeleton in the same molecule, the compounds described in JP2009-221114A, which have maximum absorption at 405 nm and have excellent sensitivity to a light source of g-rays, the compounds described in paragraph Nos. 0076 to 0079 of JP2014-137466A, and the like, may be used.

With regard to preferred examples thereof, reference can be made to paragraphs 0274 to 0275 of JP2013-29760A, the contents of which are incorporated herein by reference.

Specifically, the oxime compound is preferably a compound represented by Formula (OX-1). Incidentally, the oxime compound may be an oxime compound in which an N—O bond of oxime forms an (E) isomer, an oxime compound in which the N—O bond forms a (Z) isomer, or an oxime compound in which the N—O bond forms a mixture of an (E) isomer and a (Z) isomer.

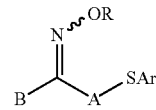

(OX-1)

In Formula (OX-1), R and B each independently represent a monovalent substituent, A represents a divalent organic group, and Ar represents an aryl group.

In Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above substituents may further be substituted with other substituents.

Examples of the substituents include a halogen atom, an aryloxy group, an alkoxycarbonyl group, an aryloxycarbonyl group, an acyloxy group, an acyl group, an alkyl group, and an aryl group.

As the monovalent substituent represented by B in Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in Formula (OX-1), an alkylene group having 1 to 12 carbon atoms, a cycloalkylene group, or an alkynylene group is preferable. These groups may have one or more substituents. Examples of the substituent include the above-mentioned substituents.

In the present invention, an oxime compound having a fluorene ring can also be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A. The contents of the publications are incorporated herein by reference.

In the present invention, an oxime compound having a nitro group can also be used as the photopolymerization initiator. The oxime compound having a nitro group is preferably used in the form of a dimer. Specific examples of the oxime compound having a nitro group include the compounds described in paragraphs 0031 to 0047 of JP2013-114249 and paragraphs 0008 to 0012, and 0070 to 0079 of JP2014-137466A, the compounds described in paragraphs 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

(C-1)

(C-2)

(C-3)

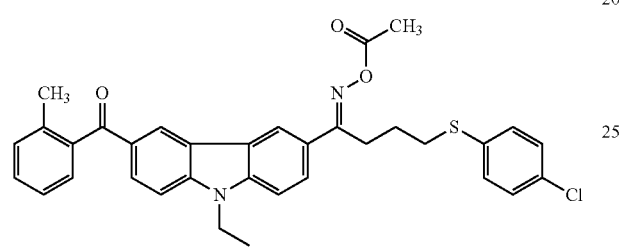

(C-4)

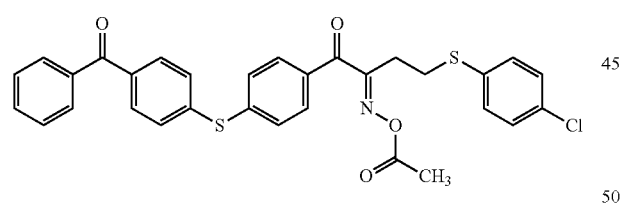

(C-5)

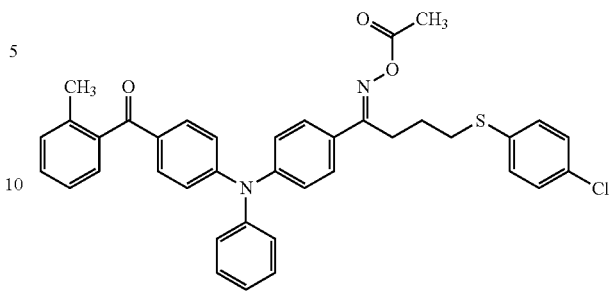

(C-6)

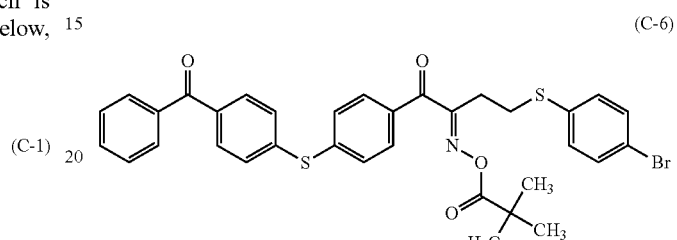

(C-7)

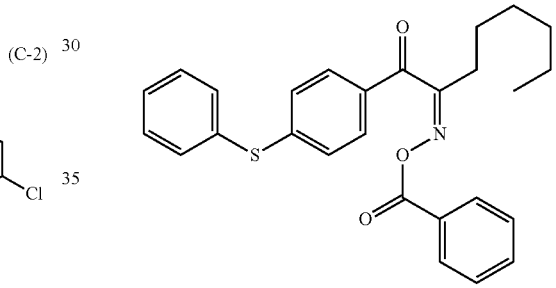

(C-8)

(C-9)

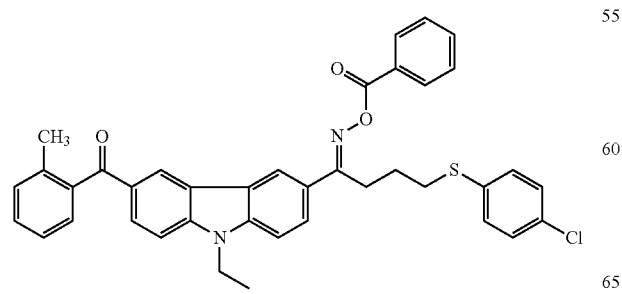

(C-10)

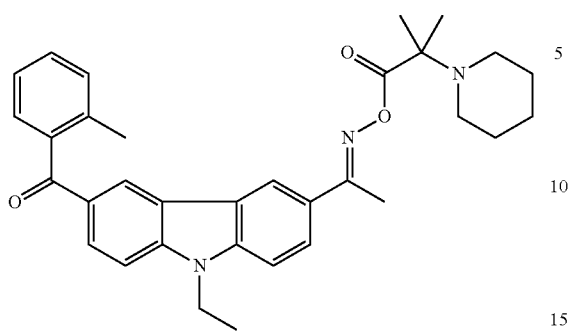

(C-14)

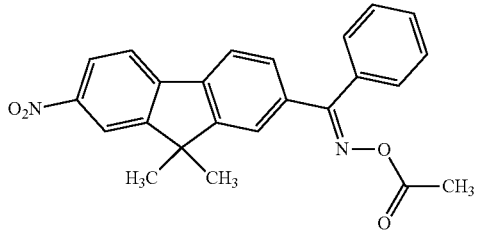

The oxime compound has a maximum absorption wavelength in a wavelength range of preferably 350 nm to 500 nm, and more preferably in a wavelength range of 360 nm to 480 nm, and an oxime compound showing a high absorbance at 365 nm and 405 nm is particularly preferable.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, and specifically, it is preferable to measure the molar light absorption coefficient by means of, for example, an ultraviolet and visible light spectrophotometer (Cary-5 spectrophotometer manufactured by Varian) by using an ethyl acetate solvent at a concentration of 0.01 g/L.

(C-11)

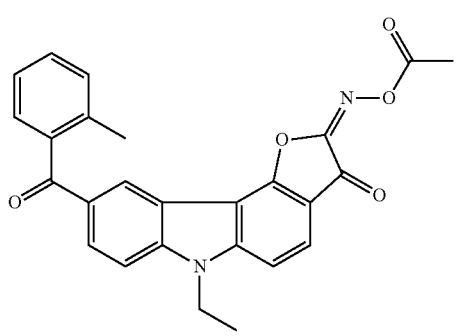

In the present invention, it is also preferable that the photopolymerization initiator is used in combination of two or more kinds thereof. For example, it is preferable to use a combination of a photopolymerization initiator with an absorption coefficient at 365 nm in methanol of $1.0\times10^3$ mL/gcm or more and a photopolymerization initiator with an absorption coefficient at 365 nm in methanol of $1.0\times10^2$ mL/gcm or less and an absorption coefficient at 254 nm in methanol of $1.0\times10^3$ mL/gcm or more. Specific examples of use of combinations include use of a combination of an aminoacetophenone compound and an oxime compound. According to this aspect, it is possible to produce a film having excellent curability even under a low-temperature condition. For example, in the pattern forming step, by exposing the composition in two steps before the developing step and after the developing step, the composition can be suitably cured with the initial exposure, and approximately the entirety of the composition can be cured by the next exposure. As a result, the curability of the composition can be improved even under the low-temperature condition.

(C-12)

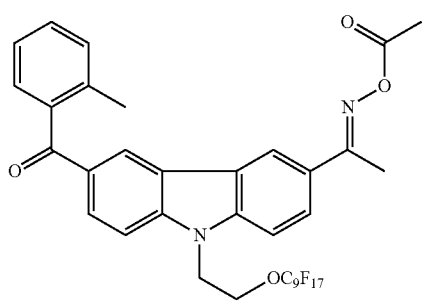

The content of the photopolymerization initiator is preferably 0.1% to 50% by mass, more preferably 0.5% to 30% by mass, and still more preferably 1% to 20% by mass, with respect to the total solid content of the composition. Within this range, better sensitivity and pattern forming properties are obtained. The curable composition of the present invention may include one kind or two or more kinds of the photopolymerization initiator. In a case where the polymerization initiator is used in combination of two or more kinds thereof, the total amount thereof is preferably within a range.

<<Compound Having Epoxy Group>>

It is also preferable that the composition for use in the method for producing a film of the present invention contains a compound having an epoxy group. According to this aspect, the solvent resistance of the obtained film can be improved. Examples of the compound having an epoxy group include monofunctional or polyfunctional glycidyl ether compounds, and polyfunctional aliphatic glycidyl (C-13)

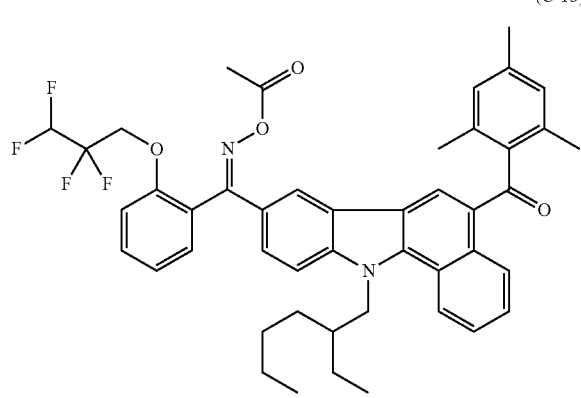

ether compounds. Further, a compound having a glycidyl group as the epoxy group, such as glycidyl(meth)acrylate or allyl glycidyl ether, or an alicyclic compound having an epoxy group can also be used.

Examples of the compound having an epoxy group include a compound having one or more epoxy groups per molecule, and the number of epoxy groups per molecule is preferably 1 to 100. The upper limit can be set to, for example, 10 or less, or to 5 or less. The lower limit is preferably 2 or more.

The epoxy equivalents (=the molecular weight of the compound having an epoxy group/the number of epoxy groups) of the compound having an epoxy group is preferably 500 g/eq or less, more preferably 100 to 400 g/eq, and still more preferably 100 to 300 g/eq.

The compound having an epoxy group may be a low molecular compound (for example, a molecular weight of less than 2,000, and further, a molecular weight of less than 1,000) or a high molecular compound (macromolecule) (for example, a molecular weight of 1,000 or more, and in the case of a polymer, a weight-average molecular weight of 1,000 or more). The weight-average molecular weight of the compound having an epoxy group is preferably 200 to 100,000, and more preferably 500 to 50,000. The upper limit of the weight-average molecular weight is preferably 10,000 or less, more preferably 5,000 or less, and still more preferably 3,000 or less.

As the compound having an epoxy group, the compounds described in paragraph Nos. 0034 to 0036 of JP2013-011869A, paragraph Nos. 0147 to 0156 of JP2014-043556A, or paragraph Nos. 0085 to 0092 of JP2014-089408A, the contents of the publications are incorporated herein by reference, can also be used. Examples of the commercially available products thereof include jER825, jER827, jER828, jER834, jER1001, jER1002, jER1003, jER1055, jER1007, jER1009, and jER1010 (all manufactured by Japan Epoxy Resins Co., Ltd.), EPICLON860, EPICLON1050, EPICLON1051, and EPICLON1055 (all manufactured by DIC Corporation) as a bisphenol A type epoxy resin; jER806, jER807, jER4004, jER4005, jER4007, and jER4010 (all manufactured by Japan Epoxy Resins Co., Ltd.), EPICLON830 and EPICLON835 (both manufactured by DIC Corporation), LCE-21 and RE-602S (both manufactured by Nippon Kayaku Co., Ltd.) as a bisphenol F type epoxy resin; jER152, jER154, jER157S70, and jER157S65 (all manufactured by Japan Epoxy Resins Co., Ltd.), EPICLON N-740, EPICLON N-770, and EPICLON N-775 (all manufactured by DIC Corporation) as a phenol novolac type epoxy resin; EPICLON N-660, EPICLON N-665, EPICLON N-670, EPICLON N-673, EPICLON N-680, EPICLON N-690, and EPICLON N-695 (all manufactured by DIC Corporation), EOCN-1020 (manufactured by Nippon Kayaku Co., Ltd.) as a cresol novolac type epoxy resin; and ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all manufactured by Daicel Chemical Industries, Ltd.), and DENACOL EX-212L, EX-214L, EX-216L, EX-321L, and EX-850L (all manufactured by Nagase ChemteX Corporation) as an aliphatic epoxy resin. Other examples include ADEKA RESIN EP-4000S, ADEKA RESIN EP-4003S, ADEKA RESIN EP-4010S, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and jER1031S (manufactured by Japan Epoxy Resins Co., Ltd.).

As the compound having an epoxy group, a compound having a glycidyl group as the epoxy group, such as glycidyl (meth)acrylate or ally! glycidyl ether, can also be used, but an unsaturated compound having an alicyclic epoxy group is preferred. With regard to such the compound, reference can be made to the descriptions in paragraph 0045 of JP2009-265518A, and the like, the contents of which are incorporated herein by reference.

The content of the compound having an epoxy group is preferably 1% to 50% by mass with respect to the total solid content of the composition. The lower limit is preferably 3% by mass or more, and more preferably 5% by mass or more. The upper limit is preferably 40% by mass or less, and more preferably 30% by mass or less. The compound having an epoxy group may be used singly or in combination of two or more kinds thereof. In a case where the compounds are used in combination of two or more kinds thereof, the total amount thereof preferably falls within the range.

<<Dye>>

The composition for use in the method for producing a film of the present invention may further contain a dye. The dye is not particularly limited, and known dyes can be used. As chemical structures thereof, a pyrazolazo-based dye, an anilinoazo-based dye, a triphenylmethane-based dye, an anthraquinone-based dye, an anthrapyridone-based dye, a benzylidene-based dye, an oxonol-based dye, a pyrazolotriazolazo-based dye, a pyridonazo-based dye, a cyanine-based dye, a phenothiazine-based dye, a pyrrolopyrazolazomethine-based dye, a xanthene-based dye, a phthalocyanine-based dye, a benzopyran-based dye, an indigo-based dye, a pyromethane-based dye, or the like can be used. In addition, multimers of these dyes may also be used. Further, the dyes described in JP2015-028144A or JP2015-34966A can also be used. Incidentally, acidic dyes and/or derivatives thereof can be suitably used as the dye. In addition, a direct dye, a basic dye, a mordant dye, an acidic mordant dye, an azoic dye, a dispersed dye, an oil-soluble dye, a food dye, and/or derivatives thereof can also be usefully used. Specific examples of the acidic dye are shown below, but are not limited thereto. For example, the following dyes and derivatives of these dyes are included.

Acid Alizarin Violet N,

Acid Blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, and 324:1, Acid Chrome Violet K, Acid Fuchsin; Acid Green 1, 3, 5, 9, 16, 25, 27, and 50, Acid Orange 6, 7, 8, 10, 12, 50, 51, 52, 56, 63, 74, 95, acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274, Acid Violet 6B, 7, 9, 17, and 19, Acid Yellow 1, 3, 7, 9, 11, 17, 23, 25, 29, 34, 36, 42, 54, 72, 73, 76, 79, 98, 99, 111, 112, 114, 116, 184, and 243, and Food Yellow 3

Moreover, in addition to the above-described examples, an azo-based acidic dye, a xanthene-based acidic dye, and a phthalocyanine-based acidic dye are also preferable, and acidic dyes such as C. I. Solvent Blue 44 and 38; C. I. Solvent Orange 45; and Rhodamine B and Rhodamine 110, and derivatives of these dyes are also preferably used.

Among these, as the dye, at least one selected from a triarylmethane-based dye, an anthraquinone-based dye, an azomethine-based dye, a benzylidene-based dye, an oxonol-based dye, a cyanine-based dye, a phenothiazine-based dye, a pyrrolopyrazolazomethine-based dye, a xanthene-based dye, a phthalocyanine-based dye, a benzopyran-based dye, an indigo-based dye, a pyrazolazo-based dye, an anilinoazo-based dye, a pyrazolotriazolazo-based dye, a pyridonazo-based dye, an anthrapyridone-based dye, and a pyromethane-based dye is preferable.

The content of the dye is preferably 0.5% to 20% by mass with respect to the total solid content of the composition. The upper limit is preferably 10% by mass or less, and more preferably 5% by mass or less. The lower limit is preferably 1% by mass or more, and more preferably 5% by mass or more. The dye may be used singly or in combination of two or more kinds thereof. In a case where the dyes are used in combination of two or more kinds thereof, the total amount thereof preferably falls within the range.

<<Coloring Inhibitor>>

The composition for use in the method for producing a film of the present invention preferably contains a coloring inhibitor. Examples of the coloring inhibitor include a phenol compound, a phosphorous acid ester compound, and a thioether compound, and the coloring inhibitor is more preferably a phenol compound having a molecular weight of 500 or more, a phosphorous acid ester compound having a molecular weight of 500 or more, or a thioether compound having a molecular weight of 500 or more is more preferable. Further, the coloring inhibitor is preferably a phenol compound, and more preferably a phenol compound having a molecular weight of 500 or more.

As the phenol compound, any of phenol compounds known as the phenol-based coloring inhibitor can be used. Preferred examples of the phenol compound include a hindered phenol compound. Particularly, a compound having a substituent at a site (ortho-position) adjacent to the phenolic hydroxyl group is preferable. As the above-mentioned substituent, a substituted or unsubstituted alkyl group having 1 to 22 carbon atoms is preferable, and a methyl group, an ethyl group, a propyl group, an isopropyl group, a butyl group, an isobutyl group, a t-butyl group, a pentyl group, an isopentyl group, a t-pentyl group, a hexyl group, an octyl group, an isooctyl group, or a 2-ethylhexyl group is more preferable. Further, a compound having a phenol group and a phosphorous acid ester group in the same molecule is also preferable.

Examples of the phosphorous acid ester compound include at least one compound selected from the group consisting of tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-ditert-butyl-6-methylphenyl)phosphites.

The coloring inhibitor is easily available as a commercially available product, and examples thereof include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, ADEKA STAB AO-330, ADEKA STAB PEP-36A, and ADEKA STAB AO-412S (ADEKA Corporation).

The content of the coloring inhibitor is preferably 0.01% to 20% by mass, and more preferably 0.3% to 15% by mass, with respect to the total solid content of the composition. The coloring inhibitor may be used singly or in combination of two or more kinds thereof. In a case where the coloring inhibitors are used in combination of two or more kinds thereof, the total amount thereof preferably falls within the range.

<<Silane Coupling Agent>>

The composition for use in the method for producing a film of the present invention may contain a silane coupling agent. According to this aspect, the silane coupling agent can improve the adhesiveness to a film. In the present invention, the silane coupling agent is a silane compound having a hydrolyzable group and other functional groups. Further, the hydrolyzable group refers to a substituent which can be directly linked to a silicon atom to generate a siloxane bond by a hydrolysis reaction and/or a condensation reaction. Examples of the hydrolyzable group include a halogen atom, an alkoxy group, and an acyloxy group, with the alkoxy group being preferable. That is, the silane coupling agent is preferably a compound having an alkoxysilyl group. Further, a functional group other than the hydrolyzable group is preferably a group which interacts with a resin or forms a bond, and thus, exhibits affinity. Examples thereof include a (meth)acryloyl group, a phenyl group, a mercapto group, an epoxy group, and an oxetanyl group, with the (meth)acryloyl group and the epoxy group being preferable. That is, the silane coupling agent is preferably a compound having an alkoxysilyl group, a (meth)acryloyl group, and/or an epoxy group.

Specific examples of the silane coupling agent include γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, phenyltrimethoxysilane, methyltrimethoxysilane, dimethyldimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxy silane, 1,6-bis(trimethoxysilyl)hexane, trifluoropropyltrimethoxysilane, hexamethyldisilanzane, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxy silane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminomethylethyl)-3-aminopropylmethyldimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, a basic salt of N-(vinylbenzyl)-2-aminoethyl-3-aminopropyltrimethoxysilane, tris-(trimethoxysilylpropyl)isocyanurate, 3-ureidopropyltriethoxysilane, 3-mercaptopropylmethyldimethoxysilane, 3-mercaptopropyltrimethoxysilane, bis(triethoxysilylpropyl)tetrasulfide, and 3-isocyanatopropyltriethoxysilane. Incidentally, in addition to the silane coupling agents, an alkoxy oligomer can be used. Further, the following compounds can also be used.

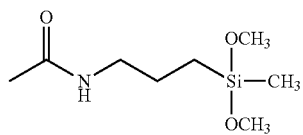

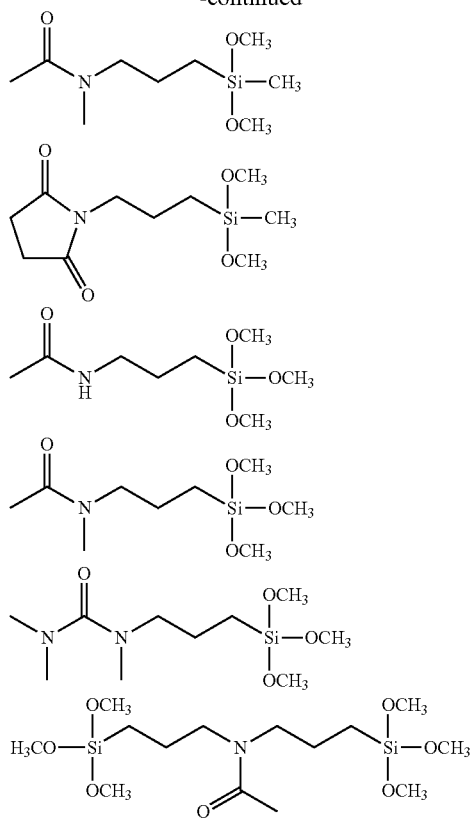

Examples of a commercially available product include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059 A, X-41-1056, X-41-1805, X-41-1818, X-41-1810, X-40-2651, X-40-2655A, KR-513, KC-89S, KR-500, KR-516, KR-517, X-40-9296, X-40-9225, X-40-9246, X-40-9250, KR-401N, X-40-9227, X-40-9247, KR-510, KR-9218, KR-213, X-40-2308, and X-40-9238, manufactured by Shin-Etsu Chemical Co., Ltd. Further, examples of the silane coupling agent include the compounds described in paragraph Nos. 0018 to 0036 of JP2009-288703A, and the compounds described in paragraphs 0056 to 0066 of JP2009-242604A, the contents of which are incorporated herein by reference.

The content of the silane coupling agent is preferably 0.01% to 15.0% by mass, and more preferably 0.05% to 10.0% by mass, with respect to the total solid content of the composition. The silane coupling agent may be used singly or in combination of two or more kinds thereof. In a case where the silane coupling agents are used in combination of two or more kinds thereof, the total amount thereof preferably falls within the range.

<<Sensitizer>>

The composition for use in the method for producing a film of the present invention may contain a sensitizer for the purposes of improving radical generation efficiency of the photopolymerization initiator, and shifting the sensitive wavelength to a longer wavelength. The sensitizer preferably sensitizes the photopolymerization initiator by the electron transfer mechanism or the energy transfer mechanism. Examples of the sensitizer include sensitizers that belong to the compounds to be listed below and have an absorption wavelength in the wavelength range of 300 nm to 450 nm. Specifically, reference can be made to the descriptions in paragraphs 0231 to 0253 of JP2010-106268A (<0256> to <0273>) of the corresponding US2011/0124824A), the contents of which are incorporated herein by reference.

The content of the sensitizer is preferably 0.1% to 20% by mass, and more preferably 0.5% to 15% by mass, with respect to the total solid content of the composition. The sensitizer may be used singly or in combination of two or more kinds thereof. In a case where the sensitizers are used in combination of two or more kinds thereof, the total amount thereof preferably falls within the range.

<<Co-Sensitizer>>

It is also preferable that the composition for use in the method for producing a film of the present invention further contains a co-sensitizer. The co-sensitizer has functions of further improving the sensitivity of the photopolymerization initiator or a sensitizer to the active radiation, suppressing the polymerization inhibition of the polymerizable compound due to oxygen, and the like. With regard to the co-sensitizer, specifically, reference can be made to the descriptions in paragraphs 0254 to 0257 of JP2010-106268A (<0277> to <0279> of the corresponding US2011/0124824A), the contents of which are incorporated herein by reference.

The content of the co-sensitizer is preferably 0.1% to 30% by mass, more preferably 1% to 25% by mass, and still more preferably 1.5% to 20% by mass, with respect to the total solid content of the composition, from the viewpoint of increasing the polymerization growth rate and the curing rate. The co-sensitizer may be used singly or in combination of two or more kinds thereof. In a case where the co-sensitizers are used in combination of two or more kinds thereof, the total amount thereof preferably falls within the range.

<<Polymerization Inhibitor>>

It is preferable that a polymerization inhibitor is added to the composition for use in the method for producing a film of the present invention in order to inhibit unnecessary polymerization of a compound having a polymerizable ethylenically unsaturated double bond (for example, a polymerizable compound) during production or preservation.

Examples of the polymerization inhibitor include:

a compound containing a phenol-based hydroxyl group (preferably a compound selected from the group consisting of hydroquinone, p-methoxyphenol, di-t-butyl-p-cresol, pyrogallol, t-butyl catechol, benzoquinone, 4,4-thiobis(3-methyl-6-t-butyl phenol), 2,2'-methylenebis(4-methyl-6-t-butyl phenol), 2,6-di-t-butyl-4-methylphenol (BHT), phenolic resins, and cresol resins);

N-oxide compounds (preferably a compound selected from the group consisting of 5,5-dimethyl-1-pyrroline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide);

piperidine 1-oxyl free radical compounds (preferably a compound selected from the group consisting of piperidine 1-oxyl free radicals, 2,2,6,6-tetramethylpiperidine 1-oxyl free radicals, 4-oxo-2,2,6,6-tetramethylpiperidine 1-oxyl free radicals, 4-hydroxy-2,2,6,6-tetramethylpiperidine 1-oxyl free radicals, 4-acetamido-2,2,6,6-tetramethylpiperidine 1-oxyl free radicals, 4-maleimide 2,2,6,6-tetramethylpiperidine 1-oxyl free radicals, and 4-phosphonoxy-2,2,6,6-tetramethylpiperidine 1-oxyl free radicals);

pyrrolidine 1-oxyl free radical compounds (preferably 3-carboxy proxy free radicals (3-carboxy-2,2,5,5-tetramethylpyrrolidine 1-oxyl free radicals));

N-nitroso phenyl hydroxylamines (preferably a compound selected from the group consisting of an N-nitrosophenylhydroxylamine cerous salt and an N-nitrosophenylhydroxylamine aluminum salt);

diazonium compounds (preferably a compound selected from the group consisting of hydrogen sulfate of 4-diazophenyldimethylamine, tetrafluoroborate of 4-diazodiphenylamine, and hexafluorophosphate of 3-methoxy-4-diazodiphenylamine);

cationic dyes;

sulfide group-containing compounds;

nitro group-containing compounds; and transition metal compounds such as $FeCl_3$ and $CuCl_2$.

Specific examples of the polymerization inhibitor include the compounds described in paragraphs 0211 to 0223 of JP2015-34961A, the contents of which are incorporated herein by reference.

The content of the polymerization inhibitor is preferably 0.01 parts by mass to 10 parts by mass, more preferably 0.01 to 8 parts by mass, and most preferably 0.01 to 5 parts by mass, with respect to 100 parts by mass of the photopolymerization initiator. By setting the content within the range, suppression of a curing reaction in a non-image area and acceleration of a curing reaction in an image area are sufficiently performed, and thus, the image forming properties and the sensitivity are improved. The polymerization inhibitor may be used singly or in combination of two or more kinds thereof. In a case where the polymerization inhibitors are used in combination of two or more kinds thereof, the total amount thereof preferably falls within the range.

<<Surfactant>>

From the viewpoint of further improving coatability, various surfactants may be added to the composition for use in the method for producing a film of the present invention. As the surfactant, various surfactants such as a fluorine-based surfactant, a non-ionic surfactant, a cationic surfactant, an anionic surfactant, and a silicon-based surfactant can be used.

By incorporating a fluorine-based surfactant into the composition for use in the method for producing a film of the present invention, liquid characteristics (in particular, fluidity) in a case of preparation of a coating liquid using the composition are further improved, and thus, the evenness of coating thickness or liquid saving properties can be further improved.

That is, in a case where a film is formed using a coating liquid to which a composition containing a fluorine-based surfactant has been applied, the interface tension between a surface to be coated and the coating liquid is reduced to improve wettability with respect to the surface to be coated, and enhance coatability with respect to the surface to be coated. As a result, even in a case where a thin film having a thickness in several micrometers is formed with a small amount of the liquid, a film with an even thickness which exhibits a small extent of thickness unevenness can be more suitably formed, which is thus effective.

The fluorine content in the fluorine-based surfactant is preferably 3% to 40% by mass. The lower limit is preferably 5% by mass or more, and more preferably 7% by mass or more. The upper limit is preferably 30% by mass or less, and more preferably 25% by mass or less. The fluorine content which falls within the above-mentioned range is effective in terms of the evenness of the thickness of the coating film, liquid saving properties, and the like, and the solubility is also good.

Specific examples of the fluorine-based surfactant include the surfactants described in paragraphs 0060 to 0064 of JP2014-41318A (paragraphs 0060 to 0064 of the pamphlet of the corresponding WO2014/17669A) and the like, and the surfactants described in paragraphs 0117 to 0132 of JP2011-132503A, and the contents of the publications are incorporated herein by reference. Examples of a commercially available product of the fluorine-based surfactant include MEGAFACE F-171, MEGAFACE F-172, MEGAFACE F-173, MEGAFACE F-176, MEGAFACE F-177, MEGAFACE F-141, MEGAFACE F-142, MEGAFACE F-143, MEGAFACE F-144, MEGAFACE R30, MEGAFACE F-437, MEGAFACE F-475, MEGAFACE F-479, MEGAFACE F-482, MEGAFACE F-554, and MEGAFACE F-780 (all manufactured by DIC Corporation), FLUORAD FC430, FLUORAD FC431, and FLUORAD FC171 (all manufactured by Sumitomo 3M Limited), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all manufactured by ASAHI GLASS Co., Ltd.), and PolyFox PF636, PF656, PF6320, PF6520, and PF7002 (manufactured by OMNOVA Solutions Inc.). For the fluorine-based surfactant, the compounds described in paragraphs 0015 to 0158 of JP2015-117327A can also be used. In addition, the following compounds can also be used as the fluorine-based surfactant.

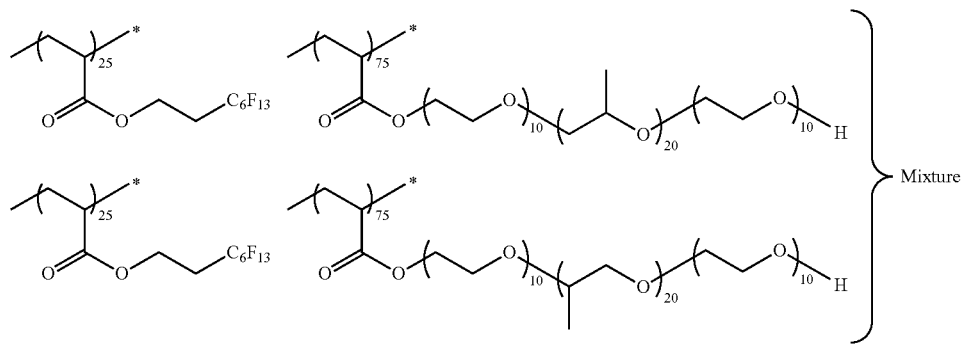

The weight-average molecular weight of the compounds is preferably 3,000 to 50,000, and is, for example, 14,000.

A fluorine-containing polymer having an ethylenically unsaturated group in a side chain can also be used as the fluorine-based surfactant. Specific examples thereof include the compounds described in paragraphs 0050 to 0090 and paragraphs 0289 to 0295 of JP2010-164965A, such as MEGAFACE RS-101, RS-102, and RS-718K, all manufactured by DIC Corporation.

Specific examples of the non-ionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2, and TETRONIC 304, 701, 704, 901, 904, and 150R1 manufactured by BASF), and PIONIN D-6512, D-6414, D-6112, D-6115, D-6120, D-6131, D-6108-W, D-6112-W, D-6115-W, D-6115-X, and D-6120-X (manufactured by Takemoto Oil & Fat Co., Ltd.).

Examples of the cationic surfactant include an organosiloxane polymer KP341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Examples of the anionic surfactant include W004, W005, and W017 (manufactured by Yusho Co., Ltd.).

Examples of the silicon-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA, TORAY SILICONE SH3OPA, and TORAY SILICONE SH8400" (all manufactured by Dow Corning Toray Co., Ltd.), "TSF-4440", "TSF-4300", "TSF-4445", "TSF-4460", and "TSF-4452" (all manufactured by Momentive Performance Materials Co., Ltd.), "KP341", "KF6001", and "KF6002" (all manufactured by Shin-Etsu Chemical Co., Ltd.), and "BYK307", "BYK323", and "BYK330" (all manufactured by BYK Chemie).

The content of the surfactant is preferably 0.001% by mass to 2.0% by mass, and more preferably 0.005% to 1.0% by mass, with respect to the total solid content of the composition. The surfactant may be used singly or in combination of two or more kinds thereof. In a case where the surfactants are used in combination of two or more kinds thereof, the total amount thereof preferably falls within the range.

<<Ultraviolet Absorber>>

The composition for use in the method for producing a film of the present invention may contain an ultraviolet absorber. As the ultraviolet absorber, a conjugated diene compound is preferable, and a compound represented by Formula (I) is more preferable.

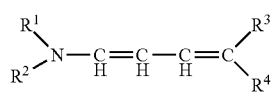

In Formula (I), $R^1$ and $R^2$ each independently represent a hydrogen atom, an alkyl group having 1 to 20 carbon atoms, or an aryl group having 6 to 20 carbon atoms, and $R^1$ and $R^2$ may be the may be the same as or different from each other, but represent a hydrogen atom at the same time in no case.

$R^1$ and $R^2$ may form a cyclic amino group with a nitrogen atom to which $R^1$ and $R^2$ are bonded to. Examples of the cyclic amino group include a piperidino group, a morpholino group, a pyrrolidino group, a hexahydroazepino group, and a piperazino group.

$R^1$ and $R^2$ are each independently preferably an alkyl group having 1 to 20 carbon atoms, more preferably an alkyl group having 1 to 10 carbon atoms, and still more preferably an alkyl group having 1 to 5 carbon atoms.

$R^3$ and $R^4$ each independently represent an electron-attractive group. Here, the electron-attractive group is an electron-withdrawing group having a Hammett's substituent constant, a σp value (hereinafter simply referred to as "σp value") from 0.20 to 1.0. The electron-attractive group is preferably an electron-withdrawing group having a σp value from 0.30 to 0.8. $R^3$ and $R^4$ may be bonded to each other to form a ring. $R^3$ and $R^4$ are each preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group.

Furthermore, at least one of $R^1$, $R^2$, $R^3$, or $R^4$ may be in the form of a polymer derived from a monomer which is bonded to a vinyl group via a linking group. A copolymer with other monomers may be used.

Specific examples of the ultraviolet absorber represented by Formula (I) include the following compounds. With regard to the descriptions of the substituent of the ultraviolet absorber represented by Formula (I)) reference can be made to paragraphs 0024 to 0033 of WO2009/123109A (<0040> to <0059> of the corresponding US2011/0039195A, the contents of which are incorporated herein by reference. With regard to specific preferred examples of the compound represented by Formula (I), reference can be made to the exemplary compounds (1) to (14) in paragraphs 0034 to 0037 of WO2009/123109A (<0060> of the corresponding US2011/0039195A), the contents of which are incorporated herein by reference.

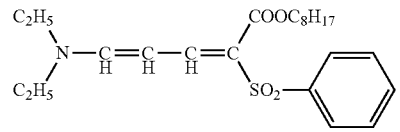

The content of the ultraviolet absorber is preferably 0.1% to 10% by mass, more preferably 0.1% to 5% by mass, and particularly preferably 0.1% to 3% by mass, with respect to the total solid content of the composition. Further, in the present invention, the ultraviolet absorber may be used singly or in combination of two or more kinds thereof. In a case where the ultraviolet absorbers are used in combination of two or more kinds thereof, the total amount thereof preferably falls within the range.

<Other Additives>

Furthermore, a known additive such as a plasticizer and a sensitizer may be added to the composition in order to improve the physical properties of a cured film. Examples of the plasticizer include dioctyl phthalate, didodecyl phthalate, triethylene glycol dicaprylate, dimethyl glycol phthalate, tricresyl phosphate, dioctyl adipate, dibutyl sebacate, and tryacetyl glycerin. The content of the plasticizer is preferably 10% by mass or less with respect to the total mass of the polymerizable compound and the resin.

<<Method of Preparing Composition>>

The above-mentioned composition can be prepared by mixing the above-mentioned components.

In the preparation of the composition, the respective components may be mixed with each other collectively or may be mixed with each other sequentially after being dissolved and/or dispersed in a solvent. In addition, the order of addition or working conditions during blending is not particularly limited.

Furthermore, examples of a process for dispersing a pigment include processes using compression, pressing, impact, shear, cavitation, and the like as a mechanical force used to disperse the pigment. Specific examples of these processes include a bead mill, a sand mill, a roll mill, a high-speed impeller, a sand grinder, a flow jet mixer, high-pressure wet atomization, and ultrasonic dispersion. In addition, the process and dispersing machine described in "Dispersion Technology Comprehension" issued by Johokiko Co., Ltd., Jul. 15, 2005; and "Actual comprehensive data collection on dispersion technology and industrial application centered on suspension (solid/liquid dispersion system), issued by Publication Department, Management Development Center, Oct. 10, 1978" can be suitably used.

It is preferable that in the preparation of the composition, filtration is performed using a filter for the purpose of removing foreign matters, reducing defects, or the like. As the filter, any filters that have been used in the related art for filtration use and the like may be used without particular limitation. Examples of the filter include filters using materials including, for example, a fluorine resin such as polytetrafluoroethylene (PTFE), a polyamide-based resin such as nylon (for example, Nylon-6 and Nylon-6,6), and a polyolefin resin (including a polyolefin resin having a high density or an ultrahigh molecular weight) such as polyethylene and polypropylene (PP). Among those materials, polypropylene (including a high-density polypropylene) and nylon are preferable.

The pore diameter of the filter is suitably approximately 0.01 to 7.0 μm, preferably approximately 0.01 to 3.0 μm, and more preferably approximately 0.05 to 0.5 μm. By setting the pore diameter of the filter to the range, fine foreign matters which inhibit the preparation of a uniform and smooth composition in the next step can be reliably removed. In addition, a fibrous filter material is also preferably used, and examples of the filter material include a polypropylene fiber, a nylon fiber, and a glass fiber, and specifically, filter cartridges of SBP type series (SBP008 and the like) manufactured by Roki Techno Co., Ltd., TPR type series (TPR002, TPR005, and the like), or SHPX type series (SHPX003 and the like) can be used.

In a case of using the filter, different filters may be combined. Here, the filtration through the first filter may be run once, or may be repeated twice or more times.

Incidentally, the first filters having different pore diameters within the range may be combined. With regard to the pore diameter of the filter herein, reference can be made to nominal values of filter manufacturers. A commercially available filter may be selected from various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, or the like, for example.

As the second filter, those formed of the same material as that of the above-described first filter may be used.

For example, the filtration through the first filter may be carried out with only a dispersion liquid, the other components may be mixed, and then the filtration through the second filter may be carried out.

<Method for Producing Film>

Next, the method for producing a film of the present invention will be described in detail. In the method for producing a film of the present invention, a composition including a pigment, a resin, and a solvent is preserved under a condition of a viscosity ranging from 30 mPa·s to 150 mPa·s, and during application of the composition, the composition is heated to 40° C. to 70° C. and applied. Hereinafter, each of the steps will be described in detail.

In the method for producing a film of the present invention, a composition including a pigment, a resin, and a solvent is preserved under a condition of a viscosity ranging from 30 mPa·s to 150 mPa·s. Preferably, the viscosity is controlled to the above-mentioned range. The upper limit of the viscosity of the composition at a temperature for the preservation is preferably 120 mPa·s or less, and more preferably 100 mPa·s or less. The lower limit is preferably 40 mPa·s or more, and more preferably 50 mPa·s or more. In a case where the viscosity in the preservation of the composition falls with the range, it is possible to effectively suppress the sedimentation of the pigment and the like during the preservation. Further, the coatability of the composition is also good, when heated to the temperature for the application. Examples of a method for increasing the viscosity of the composition during the preservation include a method of lowering a temperature for preservation, a method of increasing the concentration of the solid content of the composition (preferably the content of the resin in the solid content), and a method of adding a thickener.

During the preservation of the composition, the viscosity of the composition is measured intermittently, discontinuously, or continuously, or a viscosity, and thus, the temperature for the preservation, or the like may be controlled such that the viscosity becomes the range, or a relationship between a viscosity and the values of physical properties (for example, a temperature) related to the viscosity is previously measured, the above-mentioned values of physical properties are measured intermittently, discontinuously, or continuously, and thus, the above-mentioned values of physical properties may be controlled so as to satisfy the previously measured range. By such a method, the viscosity during the preservation can be controlled the above-mentioned range.

The sedimentation rate of the solid content of the composition at a temperature for the preservation is preferably 10% by mass or less, and more preferably 5% by mass or less. According to this aspect, it is possible to effectively suppress the sedimentation of the pigment and the like during preservation. Examples of a method for decreasing the sedimentation rate of the solid content in the composition during the preservation include a method of increasing the viscosity of the composition, a method of decreasing the concentration of the solid content of the composition, a method of increasing the dispersibility the solid content (preferably the pigment) in the composition, a method of decreasing the density of the pigment, and a method for decreasing the particle diameter of the pigment. In order to suppress the sedimentation of the pigment, the average primary particle diameter of the pigment is preferably set to 100 nm or less, more preferably set to 85 nm or less, and still more preferably set to 70 nm or less.

During preservation of the composition, the sedimentation rate of the solid content of the composition is measured intermittently, discontinuously, or continuously, and thus, the temperature for the preservation, or the like may be controlled such that the sedimentation rate of the solid content becomes the range, or a relationship between the sedimentation rate of a solid content of the composition at a temperature for the preservation and the values of physical properties (for example, a temperature) related to the sedimentation rate of the solid content of the composition at a temperature for the preservation is previously measured, the above-mentioned values of physical properties are measured intermittently, discontinuously, or continuously, and thus, the above-mentioned values of physical properties may be controlled so as to satisfy the previously measured range. With this method, the sedimentation rate of the solid content of the composition during the preservation can be controlled to the above-mentioned range.

The temperature of the composition during the preservation is preferably −20° C. to 30° C. The lower limit is preferably 0° C. or higher. The upper limit is preferably 25° C. or lower. According to this aspect, the preservation stability of the composition is good, and thus, it is possible to effectively suppress the sedimentation of the solid content such as the pigment.

In the method for producing a film of the present invention, the composition is preferably stirred and/or flowed intermittently, discontinuously, or continuously and preserved during the preservation of the composition. According to this aspect, it is possible to more effectively suppress the sedimentation of the pigment and the like during preservation. It is more preferable to perform a combination of stirring and flowing. Further, in a case of performing a combination of stirring and flowing, stirring and flowing may be performed simultaneously, or stirring and flowing may be performed alternately.

Stirring of the composition can be performed by using, for example, a stir bar or a stirring blade. The rotation speed is, for example, preferably 10 to 2,000 rpm. The lower limit is preferably 100 rpm or more, and more preferably 300 rpm or more. The upper limit is preferably 1,500 rpm or less, and more preferably 1,000 rpm or less. Further, stirring can be performed by a method of bubbling, ultrasonic waves, or the like.

Examples of a method for flowing the composition include a method of circulating the composition in a device, and a method of shaking a container for preserving the composition.

In the method for producing a film of the present invention, the composition which has been preserved in the above-mentioned state is heated to 40° C. to 70° C. (preferably 45° C. to 65° C., and more preferably 50° C. to 60° C.), and applied onto a substrate. During the application, the composition may be heated stepwise. For example, it is also preferable that the heating treatment at the first step is carried out at 30° C. to 40° C., and the heating treatment at the second step is carried out at 40° C. to 60° C. In addition, the heating treatment may also be carried out by performing heating continuously or stepwise.

The substrate is not particularly limited and can be appropriately selected according to applications. Examples of the substrate include alkali-free glass used for a liquid crystal display device and the like, soda glass, Pyrex (registered trademark) glass, quartz glass, supports obtained by attaching a transparent conductive film to these, a photoelectric conversion element substrate, a silicon substrate, or the like used for a solid-state imaging device or the like, and a complementary metal oxide film semiconductor (CMOS). Moreover, an undercoat layer may be provided on these substrates, as desired, for the purpose of improving adhesiveness to the upper layer, preventing diffusion of substances, or planarizing the surface. Examples of the application method include a spin coating method, a screen printing method, a spray application method, a slit coating method, a cast coating method, a roll coating method, and a dropwise addition method (drop cast), with the spin coating method, the screen printing method, and the spray application method being preferable, and the spin coating method being more preferable. In particular, the method for producing a film of the present invention is suitable for application using the spin coating method. Further, for the application using the spin coating method, from the viewpoint of coating suitability, the spin coating method is preferably carried out in the range of 300 to 6,000 rpm, and more preferably carried out in the range of 400 to 3,000 rpm. Further, a substrate temperature for spin coating is preferably 10° C. to 100° C., and more preferably 20° C. to 70° C. Within the range, the coating evenness is excellent, and thus, it is easy to produce a film having suppressed coating unevenness.

The thickness of the coating film is not particularly limited, and can be appropriately adjusted according to the applications. In a case of using a composition including a pigment (preferably including a white pigment), a resin (preferably including an alkali-soluble resin), a solvent, a polymerizable compound, and a photopolymerization initiator, from the viewpoints of resolution and developability, the thickness of the coating film is preferably 0.2 to 50 μm. The lower limit is more preferably 0.5 μm or more, and still more preferably 1.0 μm or more. The upper limit is more preferably 30 μm or less, and still more preferably 10 μm or less.

In the method for producing a film of the present invention, it is preferable that during application of the composition, the temperature of the above-mentioned composition is heated to 40° C. to 70° C. to adjust the viscosity of the above-mentioned composition to 1 mPa·s or more and less than 30 mPa·s. The upper limit of the viscosity of the composition during application is preferably 25 mPa·s or less, and more preferably 20 mPa·s or less. The lower limit of the viscosity of the composition during application is preferably 3 mPa·s or more, and more preferably 5 mPa·s or more. In a case the viscosity during application falls within the above-mentioned range, the coatability of the composition is good. In particular, the coatability with a spin coating method, a screen printing method, and a spray application method is excellent.

In the method for producing a film of the present invention, the composition applied onto the substrate may further be dried. The drying condition is not particularly limited, and examples of the drying method include a method in which drying is carried out under the conditions of 70° C. to 110° C. for approximately 2 to 4 minutes.

The method for producing a film of the present invention may further have a step of forming a pattern on a film formed by the application of the composition. Further, in a case where a film obtained by the method for producing a film of the present invention is used as a smooth film, a step of forming a pattern may not be carried out. In addition, in a case of further carrying out a step of forming a pattern, it is preferable that the composition includes a photopolymerization initiator and a polymerizable compound. Further, it is preferable that the resin includes an alkali-soluble resin. Hereinafter, the step of forming a pattern will be described in detail.

The step of forming a pattern preferably includes a step of patternwise exposing the film formed on the substrate (exposing step), and a step of removing an unexposed area by development to form a pattern (developing step). In addition, heating and/or exposure may further be carried out, as desired, after development.

In the exposing step, it is preferable that the film formed on the substrate is patternwise exposed. For example, the film formed on the substrate can be patternwise exposed by performing exposure through a mask having a predetermined mask pattern, using an exposure device such as a stepper. Thus, the exposed area can be cured.

As the radiation (light) which can be used during the exposure, ultraviolet rays such as g-rays and i-rays (particularly preferably i-rays) are preferably used. The irradiation dose (exposure dose) is, for example, preferably 0.03 to 2.5 $J/cm^2$, and more preferably 0.05 to 1.0 $J/cm^2$.

The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume). Further, the exposure illuminance can be appropriately set, and can be usually selected from a range of 1,000 $W/m^2$ to 100,000 $W/m^2$ (for example, 5,000 $W/m^2$, 15,000 $W/m^2$, or 35,000 $W/m^2$). Appropriate conditions of each of the oxygen concentration and the exposure illuminance may be combined, and for example, a combination of the oxygen concentration of 10% by volume and the illuminance of 10,000 $W/m^2$, a combination of the oxygen concentration of 35% by volume and the illuminance of 20,000 $W/m^2$, or the like is available.

Next, the unexposed area is removed by development to form a pattern. The removal of the unexposed area by development can be carried out using a developer. Thus, the composition layer of the unexposed area in the exposing step is eluted into the developer, and as a result, only a photocured portion remains. As the developer, an alkali developer causing no damage on the underlying circuit, or the like is preferable. The temperature of the developer is preferably, for example, 20° C. to 30° C. The development time is preferably 20 to 180 seconds, and more preferably 20 to 90 seconds.

As the alkali developer, for example, aqueous alkali solutions including alkali agents, such as inorganic alkalis such as sodium hydroxide, potassium hydroxide, sodium carbonate, sodium silicate, sodium metasilicate, and ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, tetraalkylammonium hydroxides such as dimethylbis(2-hydroxyethyl)ammonium hydroxide, tetramethylammonium hydroxide, tetraethyl ammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamyl ammonium hydroxide, and dibutyldipentylammonium hydroxide, quaternary ammonium salts such as trimethylphenylammonium hydroxide, trimethylbenzylammonium hydroxide, and triethylbenzylammonium hydroxide, and cyclic amines such as pyrrole and piperidine can be used. Further, an appropriate amount of alcohols or a surfactant may also be added to the aqueous alkali solution before use. The concentration of the alkali agent in the alkali developer is preferably 0.001% to 20% by mass, more preferably 0.01% to 10% by mass, and still more preferably 0.1% to 1% by mass. The pH of the alkali developer is preferably 10.0 to 15.0. The alkali agent concentration and the pH of the alkali developer and the pH can be appropriately adjusted before use. The alkali developer may be used after adding an appropriate amount of, for example, a water-soluble organic solvent such as methanol and ethanol, a surfactant, or the like.

After development, heating and/or exposure may be carried out. According to this aspect, curing of the film can further be performed to produce a film which has been more rigidly cured.

The film obtained by the method for producing a film of the present invention preferably has an $L^*$ in a $L^*a^*b^*$ color display system of CIE 1976 of preferably 20 to 80, and more preferably 30 to 70. A film having such a chromaticity can be preferably used as a white film having excellent whiteness. Incidentally, the $L^*$ value is a value measured using a spectrophotometer X-Rite 528 (trade name, manufactured by X-Rite Inc.) under a measurement condition of a D65 light source, an observation field of view at 2°, and a calibration reference plate as a white reference.

The film thickness of the film obtained by the method for producing a film of the present invention is preferably 0.2 to 50 µm. The lower limit is more preferably 0.5 µm or more, and still more preferably 1.0 µm or more. The upper limit is more preferably 30 µm or less, and still more preferably 10 µm or less.

The film obtained by the production method of the present invention can be used after being incorporated into a solid-state imaging device or an image display device (for example, a liquid crystal display device and an organic electroluminescence (organic EL) display device). In addition, it can also be used as a material for an application of appearance adjustment of an optical member.

Furthermore, a white film having the above-mentioned chromaticity can be used in, for example, various sensors such as a solid-state imaging device, an image display device, or the like. For example, it can also be used as a member that appropriately shields or transmits light or as a member that scatters light, after being incorporated into various sensors or image display devices. Further, it can also be used in light emitting diode (LED) reflecting applications, organic EL light-scattering layer applications, conductive materials, insulating materials, materials for a solar cell, and the like.

<Device for Producing Film>

Next, the device for producing a film of the present invention will be described.

The device for producing a film of the present invention has a preservation unit that preserves a composition including a pigment, a resin, and a solvent with a viscosity ranging from 30 mPa·s to 150 mPa·s, a heater that heats the composition preserved in the preservation unit to 40° C. to 70° C., discharge nozzles that discharge the composition heated by the heater, and a spin coater that spin-coats the composition discharged from the discharge nozzles.

The preservation unit may be any of devices (preservation devices) that preserve the above-mentioned composition with a viscosity ranging from 30 mPa·s to 150 mPa·s. For example, the preservation unit may be constituted only with a storage tank of the composition, or preferably constituted with the storage tank of the composition and a circulation path that circulates the composition in the storage tank. According to this aspect, it is possible to effectively suppress the sedimentation of the solid content of the composition, or the like by circulating the composition during the preservation.

For the management of the viscosity of the composition in the preservation unit, the preservation unit may be configured such that the viscosity of the composition in the preservation unit is measured continuously, discontinuously, or intermittently to adjust the temperature of the preservation unit for the management. Further, the preservation unit may also be configured such that the a database obtained by previously measuring a relationship between a viscosity and the values of physical properties (for example, a temperature) related to the viscosity is prepared, the above-mentioned values of physical properties are measured intermittently, discontinuously, or continuously, and adjusted with reference to the above-mentioned database for the management.

It is also preferable that the preservation unit further has a cooler. According to this aspect, it is easy to adjust the viscosity of the composition during the preservation. The cooler is not particularly limited, and coolers known in the related art can be used. Examples of the cooler include a heat dissipating fin, a fan, and a heat exchanger (including chiller equipment). The cooler may be used singly, or preferably used in combination of two or more kinds thereof.

It is also preferable that the preservation unit also has a stirrer. By incorporation of the stirrer, it is possible to effectively suppress the sedimentation of the solid content of the composition during the preservation. Examples of the stirrer include a stir bar and a stirring blade. It is preferable that the stirrer is disposed in, for example, a storage tank of the composition.

A heater is not particularly limited, and may be any one that can heat the composition. Examples thereof include a hot air heater, an infrared heater, a heating wire heater, and a heat exchanger.

The spin coater is not particularly limited. The spin coater is a device that constitutes a thin film by a centrifugal force by rotating a smooth substrate at a high speed, and devices known in the related art can be used.

One embodiment of the device for producing a film will be described with reference to FIG. 1.

The device has a storage tank 11 of the composition shown in FIG. 1. The storage tank 11 is connected with a supply pipe L1 of the composition. Further, a pipe L2 having a feed pump P1 is extended from the storage tank 11. The pipe L2 is branched into a pipe L2a connected with the storage tank 11 and into a pipe L2b connected with nozzles 30 via a heater 20. Moreover, each of flow passage switching valves V1 and V2 are disposed in the pipe L2a and the pipe L2b. Further, a spin coater 40 for spin-coating the composition discharged from the nozzles 30 is positioned at the edge of the nozzles 30. In FIG. 1, the storage tank 11, the pipe L2, and the pipe L2a correspond to the preservation unit 10 of the present invention. In addition, the pipe L2 and the pipe L2a correspond to the circulation paths of the present invention.

In the embodiment shown in FIG. 1, during the preservation of the composition, the flow passage switching valve V1 is opened, and the flow passage switching valve V2 is closed. During the preservation, the feed pump P1 may be operated or stopped. Further, in a case where the feed pump P1 is operated, it may be operated intermittently, discontinuously, or continuously. By operating the feed pump P1, the composition in the preservation unit is circulated.

On the other hand, during the application of the composition, the flow passage switching valve V1 is closed, the flow passage switching valve V2 is opended, the feed pump P1 is operated, and the heater 20 is heated. Thus, the composition in the preservation unit is discharged from the nozzles 30, and disposed on the spin coater. Further, by operating the spin coater, a film can be formed on the substrate disposed on the spin coater.

<System for Producing Film>

Next, a system for producing the film of the present invention will be described.

The system for producing the film of the present invention has a composition including a pigment, a resin, and a solvent, and the above-mentioned device for producing a film. Examples of the composition and the device for producing a film include those described above.

EXAMPLES

Hereinafter, the present invention will be specifically described with reference to Examples, but the present invention is not limited to these Examples. Further, "parts" and "%" are based on mass unless otherwise specified.

Furthermore, in Examples, the acid value was determined by a potentiometric method (solvents: tetrahydrofuran/water=54/6 (volume ratio), and a volumetric solution of a 0.1 mol/L aqueous sodium hydroxide solution (acid value)).

Moreover, the amine value was calculated by titrating a solution obtained by dissolving 3.0 g of a sample in 60 mL of acetic acid with a 0.1 mol/L $HClO_4$ acetic acid solution, using C-172 and T-111 (manufactured by Kyoto Denshi Kogyo Co.) as a glass electrode.

In addition, the viscosity was measured under a condition of a rotation speed of 5 rpm, using an E type viscometer (RE85L manufactured by Toki Sangyo Co., Ltd.) and 1°34'× R24 as a conical rotor. In addition, in a case where it could not be measured under the above-mentioned condition, the rotation speed was appropriately changed for the measurement.

The subsequent measurement of the weight-average molecular weight was carried out by directly connecting HPC-8220GPC (manufactured by Tosoh Corporation) as the measurement device, TSK Guard Column SuperHZ-L as a guard column, and TSKgel SuperHZM-M, TSKgel SuperHZ4000, TSKgel SuperHZ3000, and TSKgel SuperHZ2000 as a column, injecting 10 µl of a tetrahydrofuran solution thereinto at a sample concentration of 0.1% by mass and a column temperature of 40° C., flowing tetrahydrofuran as an elution solvent at a flow rate of 0.35 mL/min, and detecting a sample peak with a differential refractive index (RI) detection device, and the weight-average molecular weight was calculated by using a calibration curve created using standard polystyrene.

<Production of Dispersion Liquid>

A mixed solution having the following composition was subjected to a dispersion treatment as follows, using Ultra Apex Mill manufactured by Kotobuki Industries Co., Ltd. as a circulation-type dispersion device (beadmill), thereby obtaining a dispersion liquid.

~Composition~

Pigments described in the following table: Addition amounts described in the following table Dispersants described in the following table: Addition amounts described in the following table Propylene glycol-1-monomethyl ether-2-acetate (PGMEA): 52 parts by mass Incidentally, the dispersion device was operated under the following conditions.

Bead diameter: Diameter of 0.2 mm
Bead filling ratio: 65% by volume
Circumferential speed: 6 m/sec
Pump supply amount: 10.8 kg/hour
Cooling water: Tap water
Inner volume of bead mill annular passage: 0.15 L
Amount of mixed solution for dispersion treatment: 0.65 kg After initiating the dispersion, the average particle diameter of the pigments was measured every 30 minutes. The average particle diameter of the pigments decreased as the dispersion time passed, but a change amount thereof gradually decreased. At a point of time when d50 (integrated value 50%) in the particle size distribution has disappeared, dispersion was finished.

TABLE 1

| Pigment | Addition amount (parts by mass) | Dispersant | Addition amount (parts by mass) | Solvent | Addition amount (parts by mass) |
|---|---|---|---|---|---|
| Dispersant 1 | A-1 | 30 | X-1 | 18 | PGMEA | 52 |
| Dispersant 2 | A-2 | 30 | X-1 | 18 | PGMEA | 52 |
| Dispersant 3 | A-3 | 30 | X-1 | 18 | PGMEA | 52 |
| Dispersant 4 | A-4 | 30 | X-1 | 18 | PGMEA | 52 |
| Dispersant 5 | A-5 | 30 | X-1 | 18 | PGMEA | 52 |
| Dispersant 6 | A-6 | 30 | X-1 | 18 | PGMEA | 52 |
| Dispersant 7 | A-7 | 30 | X-1 | 18 | PGMEA | 52 |
| Dispersant 8 | A-5 | 30 | X-1 | 9 | PGMEA | 61 |
| Dispersant 9 | A-5 | 30 | X-1 | 3 | PGMEA | 67 |
| Dispersant 10 | A-5 | 30 | X-2 | 9 | PGMEA | 61 |
| Dispersant 11 | A-5 | 30 | X-3 | 9 | PGMEA | 61 |
| Dispersant 12 | A-5 | 30 | X-4 | 9 | PGMEA | 61 |

(Pigment)

A-1 to A-7: Pigments shown below

TABLE 2

| Product name | Type of pigment | Manufacturer | Primary particle diameter (nm) | Density (g/cm³) |
|---|---|---|---|---|
| A-1 | Brilliant1500 | Calcium carbonate | Manufactured by SHIRAISHI CALCIUM KAISHA, LTD. | 150 | 2.7 |
| A-2 | A-220 | Titanium oxide | Manufactured by ISHIHARA SANGYO KAISHA, LTD. | 160 | 4.1 |
| A-3 | PT-501R | Titanium oxide | Manufactured by ISHIHARA SANGYO KAISHA, LTD. | 180 | 4.1 |
| A-4 | CR-63 | Titanium oxide | Manufactured by ISHIHARA SANGYO KAISHA, LTD. | 210 | 4.1 |
| A-5 | CR-90-2 | Titanium oxide | Manufactured by ISHIHARA SANGYO KAISHA, LTD. | 250 | 4.1 |
| A-6 | CR-953 | Titanium oxide | Manufactured by ISHIHARA SANGYO KAISHA, LTD. | 280 | 4.1 |
| A-7 | BF-1L | Barium sulfate | Manufactured by SAKAI CHEMICAL INDUSTRY CO., LTD. | 100 | 6.0 |

A-2: "surface treating agent: Al", "specific surface area: 12 m²/g", "anatase type titanium oxide", "bulky density: 0.54 g/cm³", and "oil absorption amount: 21 g/100 g".
A-4: "surface treating agent: Al, Si, and organic substance", "specific surface area: 10 m²/g", "rutile type titanium oxide", "bulky density: 0.90 g/cm³", and "oil absorption amount: 10 g/100 g".
A-5: "surface treating agent: Al, Si, and organic substance", "specific surface area: 12 m²/g", "rutile type titanium oxide", "bulky density: 0.70 g/cm³", and "oil absorption amount: 20 g/100 g".
A-6: "surface treating agent: Al, Si, and organic substance", "specific surface area: 12 m²/g", "rutile type titanium oxide", "bulky density: 0.76 g/cm³", and "oil absorption amount: 17 g/100 g".

(Dispersant)

X-1: Solsperse 36000, manufactured by The Lubrizol Corporation

X-2: Solsperse 41000, manufactured by The Lubrizol Corporation

X-3: Resin having the following structure (acid value=51.7 mgKOH/g and Mw=13,000). The numerical values shown together with the respective repeating units represent the contents [mass ratios] of the respective repeating units. The numerical values shown together with the repeating sites of the side chain represent the repetition numbers of the repeating sites of the side chain.

X-4: Resin having the following structure (acid value=32 mgKOH/g, amine value=45 mgKOH/g, and Mw=13,000). The numerical values shown together with the respective repeating units represent the contents [mass ratios] of the respective repeating units. The numerical values shown together with the repeating sites of the side chain represent the repetition numbers of the repeating sites of the side chain.

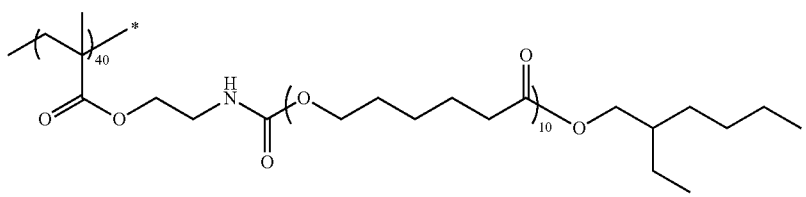

(X-3)

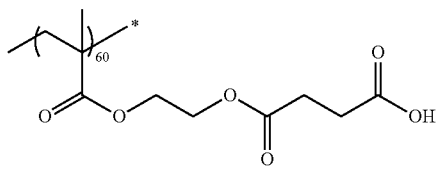

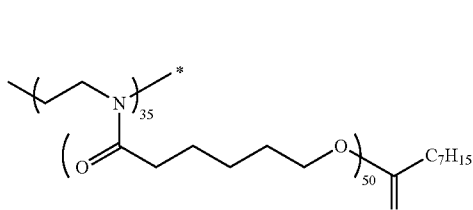 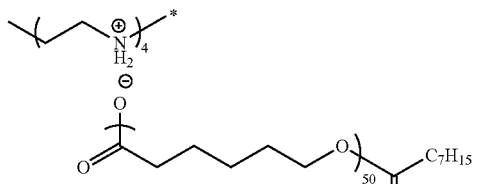

(X-4)

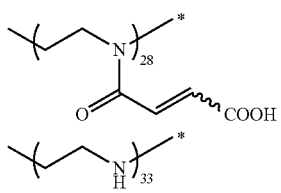

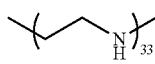

<Preparation of Composition (White Curable Composition)>

A composition was prepared by mixing the raw materials described in the following table. The values of the addition amounts described in the following table are parts by mass. The viscosity at 23° C. of the obtained composition was measured.

TABLE 3

| | Dispersion liquid | | Alkali-soluble resin | | Polymerizable compound | | Photopolymerization initiator | | Solvent | |
|---|---|---|---|---|---|---|---|---|---|---|
| | Type | Addition amount | Type | Addition amount | Type | Addition amount | Type | Addition amount | Type | Addition amount |
| White curable composition 1 | Dispersion liquid 5 | 73.1 | B-1 | 3.4 | C-1 | 10 | D-1 | 2.8 | PGMEA | 10.7 |
| White curable composition 2 | Dispersion liquid 5 | 12.8 | B-1 | 19 | C-1 | 13.5 | D-1 | 3.6 | PGMEA | 51.1 |
| White curable composition 3 | Dispersion liquid 5 | 14.3 | B-1 | 21.2 | C-1 | 14.1 | D-1 | 4 | PGMEA | 46.4 |
| White curable composition 4 | Dispersion liquid 5 | 12.8 | B-1 | 19 | C-1 | 13.5 | D-1 | 3.6 | PGMEA | 50.8 |
| White curable composition 5 | Dispersion liquid 5 | 12.8 | B-1 | 19 | C-1 | 13.5 | D-1 | 3.6 | PGMEA | 50.8 |
| White curable composition 6 | Dispersion liquid 5 | 12.8 | B-1 | 19 | C-1 | 13.5 | D-1 | 3.6 | PGMEA | 50.8 |
| White curable composition 7 | Dispersion liquid 5 | 12.8 | B-1 | 19 | C-1 | 13.5 | D-1 | 3.6 | PGMEA | 50.8 |
| White curable composition 8 | Dispersion liquid 5 | 12.8 | B-1 | 19 | C-1 | 13.5 | D-1 | 3.6 | PGMEA | 48.6 |
| White curable composition 9 | Dispersion liquid 5 | 12.8 | B-1 | 19 | C-1 | 13.5 | D-1 | 3.6 | PGMEA | 48.6 |
| White curable composition 10 | Dispersion liquid 5 | 12.8 | B-1 | 19 | C-1 | 13.5 | D-1 | 3.6 | PGMEA | 50.3 |
| White curable composition 11 | Dispersion liquid 5 | 12.8 | B-1 | 19 | C-1 | 13.5 | D-1 | 3.6 | PGMEA | 47.8 |

TABLE 3-continued

| | | | | | | | | | |
|---|---|---|---|---|---|---|---|---|---|
| White curable composition 12 | Dispersion liquid 5 | 12.8 | B-2 | 19 | C-1 | 13.5 | D-1 | 3.6 | PGMEA | 47.8 |
| White curable composition 13 | Dispersion liquid 5 | 12.8 | B-1/B-2 | 10/9 | C-1 | 13.5 | D-1 | 3.6 | PGMEA | 47.8 |
| White curable composition 14 | Dispersion liquid 5 | 12.8 | B-2 | 19 | C-2 | 13.5 | D-1 | 3.6 | PGMEA | 47.8 |
| White curable composition 15 | Dispersion liquid 5 | 12.8 | B-2 | 19 | C-1/C-2 | 7/6.5 | D-1 | 3.6 | PGMEA | 47.8 |
| White curable composition 16 | Dispersion liquid 5 | 12.8 | B-2 | 19 | C-2 | 13.5 | D-2 | 3.6 | PGMEA | 47.8 |
| White curable composition 17 | Dispersion liquid 5 | 12.8 | B-2 | 19 | C-2 | 13.5 | D-3 | 3.6 | PGMEA | 47.8 |
| White curable composition 18 | Dispersion liquid 5 | 12.8 | B-2 | 19 | C-2 | 13.5 | D-4 | 3.6 | PGMEA | 47.8 |
| White curable composition 19 | Dispersion liquid 5 | 12.8 | B-2 | 19 | C-2 | 13.5 | D-5 | 3.6 | PGMEA | 47.8 |
| White curable composition 20 | Dispersion liquid 5 | 12.8 | B-2 | 19 | C-2 | 13.5 | D-1/D-5 | 3.0/1.6 | PGMEA | 47.8 |
| White curable composition 21 | Dispersion liquid 5 | 12.8 | B-2 | 19 | C-2 | 13.5 | D-4 | 3.6 | PGMEA/cyclohexanone | 27.8/20 |
| White curable composition 22 | Dispersion liquid 1 | 73.1 | B-2 | 3.4 | C-2 | 10 | D-3 | 2.8 | PGMEA | 7.4 |
| White curable composition 23 | Dispersion liquid 1 | 12.8 | B-2 | 19 | C-2 | 13.5 | D-3 | 3.6 | PGMEA | 47.8 |
| White curable composition 24 | Dispersion liquid 2 | 73.1 | B-2 | 3.4 | C-2 | 10 | D-3 | 2.8 | PGMEA | 7.4 |
| White curable composition 25 | Dispersion liquid 2 | 12.8 | B-2 | 19 | C-2 | 13.5 | D-3 | 3.6 | PGMEA | 47.8 |
| White curable composition 26 | Dispersion liquid 3 | 73.1 | B-2 | 3.4 | C-2 | 10 | D-3 | 2.8 | PGMEA | 7.4 |
| White curable composition 27 | Dispersion liquid 3 | 12.8 | B-2 | 19 | C-2 | 13.5 | D-3 | 3.6 | PGMEA | 47.8 |
| White curable composition 28 | Dispersion liquid 4 | 73.1 | B-2 | 3.4 | C-2 | 10 | D-3 | 2.8 | PGMEA | 7.4 |
| White curable composition 29 | Dispersion liquid 4 | 12.8 | B-2 | 19 | C-2 | 13.5 | D-3 | 3.6 | PGMEA | 47.8 |
| White curable composition 30 | Dispersion liquid 6 | 73.1 | B-2 | 3.4 | C-2 | 10 | D-3 | 2.8 | PGMEA | 7.4 |
| White curable composition 31 | Dispersion liquid 6 | 12.8 | B-2 | 19 | C-2 | 13.5 | D-3 | 3.6 | PGMEA | 47.8 |
| White curable composition 32 | Dispersion liquid 7 | 73.1 | B-2 | 3.4 | C-2 | 10 | D-3 | 2.8 | PGMEA | 7.4 |
| White curable composition 33 | Dispersion liquid 7 | 12.8 | B-2 | 19 | C-2 | 13.5 | D-3 | 3.6 | PGMEA | 47.8 |
| Comparative white curable composition 1 | Dispersion liquid 5 | 46.5 | B-1 | 2.1 | C-1 | 6.7 | D-1 | 1.8 | PGMEA | 42.9 |
| Comparative white curable composition 2 | Dispersion liquid 5 | 66.5 | B-1 | 3 | C-1 | 9.1 | D-1 | 2.6 | PGMEA | 18.8 |
| Comparative white curable composition 3 | Dispersion liquid 5 | 15.7 | B-1 | 23.9 | C-1 | 15.6 | D-1 | 4.4 | PGMEA | 40.4 |

| | Coloring inhibitor | | Epoxy compound | | Ultraviolet absorber | | Silane coupling agent | | Viscosity |
|---|---|---|---|---|---|---|---|---|---|
| | Type | Addition amount | Type | Addition amount | Type | Addition amount | Type | Addition amount | (mPa · s) at 23° C. |
| White curable composition 1 | — | | — | | — | | — | | 31.5 |
| White curable composition 2 | — | | — | | — | | — | | 65.1 |
| White curable composition 3 | — | | — | | — | | — | | 130.5 |
| White curable composition 4 | F-1 | 0.3 | — | | — | | — | | 67.2 |
| White curable composition 5 | F-2 | 0.3 | — | | — | | — | | 67.9 |
| White curable composition 6 | F-3 | 0.3 | — | | — | | — | | 69.3 |
| White curable composition 7 | F-4 | 0.3 | — | | — | | — | | 66.9 |
| White curable composition 8 | F-3 | 0.3 | G-1 | 2.2 | — | | — | | 67.8 |
| White curable composition 9 | F-3 | 0.3 | G-2 | 2.2 | — | | — | | 69 |
| White curable composition 10 | F-3 | 0.3 | — | | H-1 | 0.5 | — | | 70.1 |
| White curable composition 11 | F-3 | 0.3 | — | | H-1 | 0.5 | I-1 | 2.5 | 66.9 |
| White curable composition 12 | F-3 | 0.3 | — | | H-1 | 0.5 | I-1 | 2.5 | 66.9 |
| White curable composition 13 | F-3 | 0.3 | — | | H-1 | 0.5 | I-1 | 2.5 | 66.9 |
| White curable composition 14 | F-3 | 0.3 | — | | H-1 | 0.5 | I-1 | 2.5 | 66.9 |
| White curable composition 15 | F-3 | 0.3 | — | | H-1 | 0.5 | I-1 | 2.5 | 66.9 |
| White curable composition 16 | F-3 | 0.3 | — | | H-1 | 0.5 | I-1 | 2.5 | 66.9 |
| White curable composition 17 | F-3 | 0.3 | — | | H-1 | 0.5 | I-1 | 2.5 | 66.9 |
| White curable composition 18 | F-3 | 0.3 | — | | H-1 | 0.5 | I-1 | 2.5 | 66.9 |
| White curable composition 19 | F-3 | 0.3 | — | | H-1 | 0.5 | I-1 | 2.5 | 66.9 |
| White curable composition 20 | F-3 | 0.3 | — | | H-1 | 0.5 | I-1 | 2.5 | 66.9 |

TABLE 3-continued

| | | | | | | | | |
|---|---|---|---|---|---|---|---|---|
| White curable composition 21 | F-3 | 0.3 | — | H-1 | 0.5 | I-1 | 2.5 | 66.9 |
| White curable composition 22 | F-3 | 0.3 | — | H-1 | 0.5 | I-1 | 2.5 | 33.4 |
| White curable composition 23 | F-3 | 0.3 | — | H-1 | 0.5 | I-1 | 2.5 | 68.8 |
| White curable composition 24 | F-3 | 0.3 | — | H-1 | 0.5 | I-1 | 2.5 | 33.4 |
| White curable composition 25 | F-3 | 0.3 | — | H-1 | 0.5 | I-1 | 2.5 | 68.8 |
| White curable composition 26 | F-3 | 0.3 | — | H-1 | 0.5 | I-1 | 2.5 | 32.7 |
| White curable composition 27 | F-3 | 0.3 | — | H-1 | 0.5 | I-1 | 2.5 | 70.1 |
| White curable composition 28 | F-3 | 0.3 | — | H-1 | 0.5 | I-1 | 2.5 | 31.5 |
| White curable composition 29 | F-3 | 0.3 | — | H-1 | 0.5 | I-1 | 2.5 | 65.9 |
| White curable composition 30 | F-3 | 0.3 | — | H-1 | 0.5 | I-1 | 2.5 | 32.4 |
| White curable composition 31 | F-3 | 0.3 | — | H-1 | 0.5 | I-1 | 2.5 | 69.4 |
| White curable composition 32 | F-3 | 0.3 | — | H-1 | 0.5 | I-1 | 2.5 | 33.3 |
| White curable composition 33 | F-3 | 0.3 | — | H-1 | 0.5 | I-1 | 2.5 | 67 |
| Comparative white curable composition 1 | — | — | — | — | — | — | — | 5.8 |
| Comparative white curable composition 2 | — | — | — | — | — | — | — | 16.6 |
| Comparative white curable composition 3 | — | — | — | — | — | — | — | 158.5 |

The raw materials described in the table are as follows.
(Dispersion Liquid)
Dispersion liquids 1 to 7: Dispersion liquids 1 to 7 above
(Alkali-Soluble Resin)
B-1: Resin having the following structure (acid value=113 mgKOH/g and Mw=33,000). The numerical values shown together with the respective repeating units represent the contents [mass ratios] of the respective repeating units.
B-2: Resin having the following structure (acid value=32 mgKOH/g and Mw=14,000). The numerical values shown together with the respective repeating units represent the contents [mass ratios] of the respective repeating units.

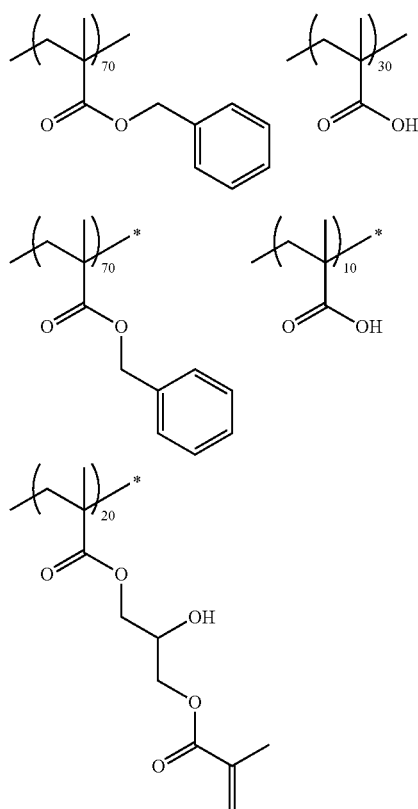

(Polymerizable Compound)
C-1: KAYARAD DPHA (manufactured by Nippon Kayaku Co., Ltd.)
C-2: NK ESTER A-TMMT (manufactured by Shin-Nakamura Chemical Co., Ltd.) (Photopolymerization Initiator)
D-1: IRGACURE OXE01 (manufactured by BASF)
D-2: IRGACURE 379 (manufactured by BASF)
D-3: IRGACURE TPO (manufactured by BASF)
D-4: IRGACURE 819 (manufactured by BASF)
D-5: ADEKA ARKLS NCI-831 (manufactured by ADEKA Corporation) (Solvent)
PGMEA: Propylene glycol-1-monomethyl ether-2-acetate (Coloring Inhibitor)
F-1: ADEKA STAB PEP-36A (manufactured by ADEKA Corporation)
F-2: ADEKA STAB AO-50 (manufactured by ADEKA Corporation)
F-3: ADEKA STAB AO-80 (manufactured by ADEKA Corporation)
F-4: ADEKA STAB AO-412S (manufactured by ADEKA Corporation) (Epoxy Compound)
G-1: EHPE 3150 (manufactured by Daicel Corporation)
G-2: EPICLON N-695 (manufactured by DIC Corporation)
(Ultraviolet Absorber)
H-1: The following structure

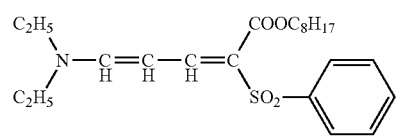

(Silane Coupling Agent)
I-1: (N-2-(Aminomethyl ethyl)-3-aminopropylmethyldimethoxysilane)
<Evaluation>
Each of the compositions obtained above was preserved at 23° C. for 1 month and then evaluated as follows. Further, in Examples 4 to 36, and Comparative Examples 1 to 3, stirring was performed under a condition of 400 rpm, using a magnetic stir bar HS-50D manufactured by AS ONE Corporation. In addition, in Examples 1 to 3, the composition was left to stand and preserved.

(Coating Suitability)

The composition which had been preserved for 1 month was left to stand in a constant-temperature oven at the temperature described in Table 4 for 12 hours. The composition heated to the temperature described in Table 4 was applied onto a 4 inch (100 mm) wafer under the conditions of 300 rpm for 5 seconds and a main rotation speed for 20 seconds, using a spin coater MS-B100 manufactured by Mikasa Co., Ltd., thereby producing a film having a film thickness of 3.0 μm. The main rotation speeds at the time were classified as follows for evaluation of coating suitability.

A: Application to a film thickness of 3.0 μm can be performed at a main rotation speed from 1,000 to 2,000 rpm.

B: Application to a film thickness of 3.0 μm cannot be performed under a condition of A, but application to a film thickness of 3.0 μm can be carried out at a main rotation speed in the range of 750 or more and less than 1,000 rpm, and more than 2,000 rpm and 2,500 rpm or less.

C: Application to a film thickness of 3.0 μm cannot be performed under the conditions of A and B, but application to a film thickness of 3.0 μm can be performed at a main rotation speed in the range of 500 or more and less than 750 rpm, and more than 2,500 rpm and 3,000 rpm or less.

D: Application to a film thickness of 3.0 μm cannot be performed under the conditions of A to C, but application to a film thickness of 3.0 μm can be performed at a main rotation speed in the range of more than 3,000 and 4,000 rpm or less.

E: Application to a film thickness of 3.0 μm cannot be performed in the range of the main rotation speeds.

Evaluations as A to C are considered to have no problem in practical use.

(Solvent Resistance)

The composition which had been preserved for 1 month was applied onto a 8 inch (200 mm) glass wafer with an undercoat layer such that the film thickness after drying reached 3.0 μm, using a spin coater, and a heating treatment (prebaking) was carried out, using a hot plate at 110° C. for 120 seconds. Subsequently, exposure was carried out through a mask with a pattern in 2 cm×2 cm at 1,000 mJ/cm$^2$ with light at a wavelength of 365 nm, using an i-ray stepper exposure device FPA-3000i5+ (manufactured by Canon Inc.).

Thereafter, the glass wafer having the exposed coating film formed thereon was placed on a horizontal rotary table of a spin-shower developing machine (DW-30 Type, manufactured by Chemitronics Co., Ltd.), and subjected to puddle development at 23° C. for 60 seconds, using a 0.3% by mass aqueous tetramethylammonium hydroxide (TMAH) solution, to form a white pattern on the glass wafer. The glass wafer on which the white pattern had been formed was fixed to the horizontal rotary table in a vacuum chuck mode, and while the glass wafer was rotated by a rotating apparatus at a rotation speed of 50 rpm, it was subjected to a rinsing treatment by supplying pure water provided in shower from above the rotational center from nozzles, and then spray-dried.

The transmittance at a wavelength of 400 to 700 nm in the white pattern and the white pattern which had been dipped in N-methyl-2-pyrrolidinone for 5 minute was measured using MCPD-3000 (manufactured by Otsuka Electronics Co., Ltd.). With regard to the spectral variation (ΔT %), a variation at a wavelength having the most spectral variation was defined as ΔT % max, and the solvent resistance was evaluated. As the variation is smaller, the solvent resistance is better and more preferable.

A: ΔTmax<0.5%
B: 0.5%≤ΔTmax<1.0%
C: 1.0%≤ΔTmax<3.0%
D: 3.0%≤ΔTmax<5.0%
E: ΔTmax≥5.0%

In the evaluation standards, A to D are levels at which there is no problem in practical use.

(Pattern Shape)

The composition which had been preserved for 1 month was applied onto a 8 inch (200 mm) silicon wafer with an undercoat layer such that the film thickness after drying reached 3.0 μm, by a spin coating method, and a heating treatment (prebaking) was carried out, using a hot plate at 110° C. for 120 seconds. Subsequently, the silicon wafer was exposed (at an exposure dose of 50 to 1,700 mJ/cm$^2$) through a mask with an island pattern in 20 μm$^2$, using an i-ray stepper exposure device FPA-3000i5+(manufactured by Canon Inc.). Then, the silicon wafer was developed using a development apparatus (Act8 manufactured by Tokyo Electron Ltd.). The silicon wafer was subjected to shower development at 23° C. for 60 seconds, using a 0.3% by mass aqueous tetramethylammonium hydroxide (TMAH) solution as a developer. Thereafter, the silicon wafer was rinsed in spin shower using pure water and spin-dried to form a pattern. The shape of the obtained pattern was observed (magnification: 5,000 times), using a scanning electron microscope (SEM) (S-4800H, manufactured by Hitachi High-Technologies Corporation), and evaluated. The evaluation standards of the pattern shape are as follows. Evaluations as A to D are considered to indicate that there is no problem in practical use.

Figure 2:
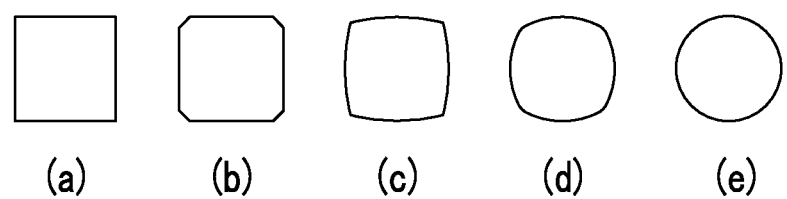
FIG. 2 is a view showing a standard for pattern evaluation.

A: One side of the pattern is linear as in (a) of FIG. 2.

B: Corners of the pattern is slightly rounded as in (b) of FIG. 2.

C: One side of the pattern is slightly rounded as in (c) of FIG. 2.

D: The pattern is rounded as in (d) of FIG. 2.

E: The pattern is rounded as in (e) of FIG. 2.

(Adhesiveness)

A pattern group having a pattern size of 20 μm out of the pattern substrates prepared in the evaluation of the pattern shape was observed with an optical microscope (manufactured by Olympus Corporation). The evaluation standards of the adhesiveness are as follows. Evaluations as A to D are considered to indicate that there is no problem in practical use.

A: There is no peeling•chipping in the pattern.

B: The peeling•chipping of the pattern as observed is more than 0% and less than 5%.

C: The peeling•chipping of the pattern as observed is 5% or more and less than 10%.

D: The peeling•chipping of the pattern as observed is 10% or more and less than 30%.

E: The peeling•chipping of the pattern as observed is less than 30%.

(Coloring Properties)

The spectrum of the pattern prepared by the same method as for the evaluation of solvent resistance was measured, using a spectrophotometer X-Rite 528 (trade name, manufactured by X-Rite, Inc.) under measurement conditions of a D65 light source and an observation field of view at 2°, with a calibration standard version as a whiteness standard. Further, in the measurement, the glass wafer having a pattern formed thereon was placed on a board coated with a black resist (black board), and measured. The OD (absorbance) of the black resist layer on the black board was 3.5 (transmittance 0.03%) at 400 nm, 3.2 (transmittance 0.06%) at 550 nm, and 2.5 (transmittance 0.32%) at 700 nm, and the average reflectance in the range of 400 nm to 700 nm was 7%. The OD of the black board was measured by "MCPD-3000" manufactured by Otsuka Electronics Co., Ltd., and the reflectance was measured by "SPECTROPHOTOMETER CM-2600" manufactured by Konica Minolta Co., Ltd.

The prepared pattern was heated using a hot plate at 265° C. for 15 minutes, the spectrum of the pattern after heating was measured, and the color difference ΔE*ab of the pattern before and after heating was calculated. In addition, the calculation equation of the color difference ΔE*ab is as follows.

$$\Delta E^*ab = [(\Delta L^*)^2 + (\Delta a^*)^2 + (\Delta b^*)^2]^{1/2}$$

A: The color difference ΔE*ab is 0 or more and less than 0.5.
B: The color difference ΔE*ab is 0.5 or more and less than 1.0.
C: The color difference ΔE*ab is 1.0 or more and less than 2.0.
D: The color difference ΔE*ab is 2.0 or more and less than 3.0.
E: The color difference ΔE*ab is 3.0 or more.
(Coating Unevenness)

The composition which had been preserved for 1 month was applied onto a 8 inch (200 mm) silicon wafer with an undercoat layer such that the film thickness after drying reached 3.0 μm, using a spin coater, and a heating treatment (prebaking) was carried out, using a hot plate at 110° C. for 120 seconds. Thereafter, the unevenness in the stripe shape of the coated surface was visually observed under a fluorescent lamp and a sodium light source, and evaluated according to the following standard. Evaluations as A to D are considered to indicate that there is no problem in practical use.

A: There is no unevenness in the stripe shape of the coated surface under both a fluorescent lamp and a sodium light source,
B: 1 to 5 portions with unevenness in the stripe shape were observed only under a sodium light source.
C: 6 to 10 portions with unevenness in the stripe shape were observed only under a fluorescent lamp.
D: 1 to 5 portions with unevenness in the stripe shape were observed only under a fluorescent lamp.
E: 6 or more portions with unevenness in the stripe shape were observed only under a fluorescent lamp.

TABLE 4

| | | Coating suitability | | | | | | Coating unevenness | |
| --- | --- | --- | --- | --- | --- | --- | --- | --- | --- |
| | White curable composition | Coating temperature | Evaluation results | Solvent resistance | Adhesiveness | Pattern shape | Coloring properties | Stirred or not stirred | Evaluation results |
| Example 1 | White curable composition 1 | 40° C. | B | C | C | C | D | Not stirred | C |
| Example 2 | White curable composition 2 | 50° C. | A | C | C | C | D | Not stirred | C |
| Example 3 | White curable composition 3 | 65° C. | B | C | C | C | D | Not stirred | C |
| Example 4 | White curable composition 1 | 40° C. | B | C | C | C | D | Stirred | B |
| Example 5 | White curable composition 2 | 50° C. | A | C | C | C | D | Stirred | B |
| Example 6 | White curable composition 3 | 65° C. | B | C | C | C | D | Stirred | B |
| Example 7 | White curable composition 4 | 50° C. | A | C | C | C | C | Stirred | B |
| Example 8 | White curable composition 5 | 50° C. | A | C | C | C | C | Stirred | B |
| Example 9 | White curable composition 6 | 50° C. | A | C | C | C | B | Stirred | B |
| Example 10 | White curable composition 7 | 50° C. | A | C | C | C | C | Stirred | B |
| Example 11 | White curable composition 8 | 50° C. | A | A | C | C | B | Stirred | B |
| Example 12 | White curable composition 9 | 50° C. | A | B | C | C | B | Stirred | B |
| Example 13 | White curable composition 10 | 50° C. | A | C | C | B | B | Stirred | B |
| Example 14 | White curable composition 11 | 50° C. | A | C | B | A | B | Stirred | B |
| Example 15 | White curable composition 12 | 50° C. | A | B | B | A | B | Stirred | B |
| Example 16 | White curable composition 13 | 50° C. | A | C | B | A | B | Stirred | B |
| Example 17 | White curable composition 14 | 50° C. | A | A | A | A | B | Stirred | B |
| Example 18 | White curable composition 15 | 50° C. | A | B | B | A | B | Stirred | B |
| Example 19 | White curable composition 16 | 50° C. | A | A | A | A | B | Stirred | B |
| Example 20 | White curable composition 17 | 50° C. | A | A | A | A | A | Stirred | B |
| Example 21 | White curable composition 18 | 50° C. | A | A | A | A | A | Stirred | B |
| Example 22 | White curable composition 19 | 50° C. | A | A | A | A | B | Stirred | B |
| Example 23 | White curable composition 20 | 50° C. | A | A | A | A | B | Stirred | B |
| Example 24 | White curable composition 21 | 50° C. | A | A | A | A | A | Stirred | B |
| Example 25 | White curable composition 22 | 40° C. | B | A | A | A | A | Stirred | A |
| Example 26 | White curable composition 23 | 50° C. | A | A | A | A | A | Stirred | A |
| Example 27 | White curable composition 24 | 40° C. | B | A | A | A | A | Stirred | A |
| Example 28 | White curable composition 25 | 50° C. | A | A | A | A | A | Stirred | A |
| Example 29 | White curable composition 26 | 40° C. | B | A | A | A | A | Stirred | A |
| Example 30 | White curable composition 27 | 50° C. | A | A | A | A | A | Stirred | A |
| Example 31 | White curable composition 28 | 40° C. | B | A | A | A | A | Stirred | B |
| Example 32 | White curable composition 29 | 50° C. | A | A | A | A | A | Stirred | B |
| Example 33 | White curable composition 30 | 40° C. | B | A | A | A | A | Stirred | B |
| Example 34 | White curable composition 31 | 50° C. | A | A | A | A | A | Stirred | B |
| Example 35 | White curable composition 32 | 40° C. | B | A | A | A | A | Stirred | C |
| Example 36 | White curable composition 33 | 50° C. | A | A | A | A | A | Stirred | C |
| Comparative Example 1 | Comparative white curable composition 1 | 40° C. | E | D | B | B | D | Stirred | E |
| Comparative Example 2 | Comparative white curable composition 2 | 40° C. | E | D | B | B | D | Stirred | E |
| Comparative Example 3 | Comparative white curable composition 3 | 70° C. | E | D | B | B | D | Stirred | E |

As shown in the above table, in Examples, the coating suitability was good, and thus, it was possible to produce a film having suppressed coating unevenness.

In contrast, in Comparative Examples, the coating suitability was deteriorated. In addition, the coating unevenness easily occurred.

EXPLANATION OF REFERENCES

10: preservation unit
11: storage tank
20: heater
30: nozzle
40: spin coater
L1, L2, L2a, and L2b: pipes
P1: feed pump
V1 and V2: flow passage switching valves

What is claimed is:

1. A method for producing a film, comprising:
preserving a composition including a pigment, a resin, and a solvent under a condition of a viscosity ranging from 30 mPa·s to 70.1 mPa·s at −20° C. to 30° C.;
heating the composition to 40° C. to 70° C.; and
applying the composition at 40° C. to 70° C. by a spin coating method,
wherein the pigment includes titanium oxide, and an average primary particle diameter of the titanium oxide is 50 nm or more and 250 nm or less.

2. The method for producing a film according to claim 1, wherein the composition during the preservation has a sedimentation rate of a solid content of the composition of 10% by mass or less, when centrifuged under a condition of 3,500 revolutions for 47 minutes at a temperature for the preservation of the composition.

3. The method for producing a film according to claim 1, wherein the composition is heated to 40° C. to 70° C. to adjust the viscosity of the composition to 1 mPa·s or more and less than 30 mPa·s during the application of the composition.

4. The method for producing a film according to claim 1, wherein the composition is preserved by stirring intermittently, discontinuously, or continuously during the preservation of the composition.

5. The method for producing a film according to claim 1, wherein the composition is preserved by allowing the composition to flow intermittently, discontinuously, or continuously during the preservation of the composition.

6. The method for producing a film according to claim 1, wherein the composition further includes a polymerizable compound and a photopolymerization initiator.

7. The method for producing a film according to claim 6, wherein the photopolymerization initiator includes an oxime compound.

8. The method for producing a film according to claim 1, wherein the composition further includes a coloring inhibitor.

9. The method for producing a film according to claim 8, wherein the coloring inhibitor is a phenol compound.

10. The method for producing a film according to claim 1, wherein the composition further includes an epoxy compound.

11. The method for producing a film according to claim 1, further comprising forming a pattern on a film formed by the application of the composition.

12. The method for producing a film according to claim 1, wherein an average primary particle diameter of the titanium oxide is 50 nm or more and 180 nm or less.

13. The method for producing a film according to claim 1, wherein the titanium oxide is an anatase type titanium oxide.

14. The method for producing a film according to claim 1, wherein the specific surface area of the titanium oxide is 10 to 20 $m^2/g$.

15. The method for producing a film according to claim 1, wherein a purity of titanium dioxide of the titanium oxide is 85% or more.

16. A method for producing a film, comprising:
preserving a composition including a pigment, a resin, and a solvent by stirring intermittently, discontinuously, or continuously under a condition of a viscosity ranging from 30 mPa·s to 70.1 mPa·s;
heating the composition to 40° C. to 70° C.; and
applying the composition at 40° C. to 70° C. by a spin coating method,
wherein the pigment includes titanium oxide, and an average primary particle diameter of the titanium oxide is 50 nm or more and 250 nm or less.

17. A method for producing a film, comprising:
preserving a composition including a pigment, a resin, and a solvent by allowing the composition to flow intermittently, discontinuously, or continuously under a condition of a viscosity ranging from 30 mPa·s to 70.1 mPa·s;
heating the composition to 40° C. to 70° C.; and
applying the composition at 40° C. to 70° C. by a spin coating method,
wherein the pigment includes titanium oxide, and an average primary particle diameter of the titanium oxide is 50 nm or more and 250 nm or less.

* * * * *